United States Patent
Feng et al.

(10) Patent No.: US 11,355,068 B2
(45) Date of Patent: Jun. 7, 2022

(54) SHIFT REGISTER UNIT, GATE DRIVE CIRCUIT AND DRIVE METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 260 days.

(21) Appl. No.: 16/619,105

(22) PCT Filed: Jun. 6, 2019

(86) PCT No.: PCT/CN2019/090405
§ 371 (c)(1),
(2) Date: Dec. 4, 2019

(87) PCT Pub. No.: WO2020/042705
PCT Pub. Date: Mar. 5, 2020

(65) Prior Publication Data
US 2021/0366401 A1  Nov. 25, 2021

(30) Foreign Application Priority Data
Aug. 29, 2018  (CN) .......................... 201810995745.4

(51) Int. Cl.
*G09G 5/00*       (2006.01)
*G09G 3/3266*   (2016.01)
*G11C 19/28*     (2006.01)

(52) U.S. Cl.
CPC ......... *G09G 3/3266* (2013.01); *G11C 19/287* (2013.01); *G09G 2310/0286* (2013.01); *G09G 2320/0233* (2013.01)

(58) Field of Classification Search
CPC ........ G11C 19/287; G11C 19/00; G09G 3/32; G09G 3/3266; G09G 2310/0286;
(Continued)

(56) References Cited

U.S. PATENT DOCUMENTS 9,881,543 B2   1/2018  Ma
10,424,242 B2  9/2019  Wang
(Continued)

FOREIGN PATENT DOCUMENTS

CN   101989463 A   3/2011
CN   103247275 A   8/2013
(Continued)

OTHER PUBLICATIONS

Office action issued in Chinese Application No. 201810995745.4, dated Mar. 25, 2020, 18 pages.

*Primary Examiner* — Pegeman Karimi
(74) *Attorney, Agent, or Firm* — Dave Law Group LLC; Raj S. Dave

(57) ABSTRACT

A shift register unit, a gate drive circuit, and a drive method are provided. The shift register unit includes a first input circuit, a second input circuit, and an output circuit. The first input circuit is configured to charge a first node in response to a first input signal to control a level of the first node; the second input circuit is configured to charge a second node in response to a second input signal to control a level of the second node; and the output circuit is configured to output an output signal to an output terminal under common control of the level of the first node and the level of the second node.

19 Claims, 9 Drawing Sheets

(58) Field of Classification Search
CPC .... G09G 2320/0233; G09G 3/36; G09G 5/00; G06F 3/038; G02F 1/1345
See application file for complete search history.

(56) References Cited

U.S. PATENT DOCUMENTS

| | | | |
|---|---|---|---|
| 10,546,519 B2 | 1/2020 | Wang et al. | |
| 2007/0274433 A1* | 11/2007 | Tobita | G09G 3/3677 377/64 |
| 2014/0111495 A1* | 4/2014 | Iwase | G09G 3/3677 345/211 |
| 2018/0218688 A1 | 8/2018 | Chen | |
| 2019/0164498 A1* | 5/2019 | Jang | G09G 3/3266 |

FOREIGN PATENT DOCUMENTS

| | | |
|---|---|---|
| CN | 104318904 A | 1/2015 |
| CN | 104900189 A | 9/2015 |
| CN | 105788508 A | 7/2016 |
| CN | 105788555 A | 7/2016 |
| CN | 105957470 A | 9/2016 |
| CN | 106601190 A | 4/2017 |
| CN | 109935269 A | 6/2019 |

* cited by examiner in the display phase, in response to the first input signal, charging the first node by the first input circuit, in response to the second input signal, charging the second node by the second input circuit, and under a common control of the level of the first node and the level of the second node, outputting the output signal to the output terminal by the output circuit. — S100 in the blanking phase, in response to the first input signal, charging the first node by the first input circuit, and under a common control of the level of the first node and the level of the second node, outputting the output signal to the output terminal by the output circuit. — S200

FIG. 9

S300: in the display phase, in response to a first selection control signal and a display reset signal, resetting a first node of an m-th stage of shift register unit by a first selection reset circuit of the m-th stage of shift register unit; and in response to a second selection control signal and the display reset signal, resetting second nodes of other stages of shift register units other than the m-th stage of shift register unit by second selection reset circuits of other stages of shift register units other than the m-th stage shift register unit.

S400: in the blanking phase, in response to the first input signal, charging the first node of the m-th stage of shift register unit by a first input circuit of the m-th stage of shift register unit; and m is an integer greater than 0.

SHIFT REGISTER UNIT, GATE DRIVE CIRCUIT AND DRIVE METHOD

CROSS-REFERENCE TO RELATED APPLICATIONS

The present application is the U.S. national stage of International Patent Application No. PCT/CN2019/090405, Aug. 29, 2018, which claims priority to Chinese patent application No. 201810995745.4, filed on May 28, 2018, the entire disclosures of which are incorporated herein by reference as part of the present application.

TECHNICAL FIELD

Embodiments of the present disclosure relate to a shift register unit, a gate drive circuit, a display device, and a drive method.

BACKGROUND

In a field of display, especially in OLED (Organic Light-Emitting Diode) display panels, gate drive circuits are currently generally integrated in GATE IC. In IC design, an area of a chip is a main factor affecting the cost of the chip. How to effectively reduce the area of the chip is a key consideration for technical developers.

SUMMARY

At least one embodiment of the present disclosure provides a shift register unit, which includes a first input circuit, a second input circuit, and an output circuit. The first input circuit is configured to charge a first node in response to a first input signal to control a level of the first node; the second input circuit is configured to charge a second node in response to a second input signal to control a level of the second node; and the output circuit is configured to output an output signal to an output terminal under common control of the level of the first node and the level of the second node.

For example, the shift register unit provided by an embodiment of the present disclosure further includes a first selection reset circuit and a second selection reset circuit. The first selection reset circuit is connected to the first node, and is configured to reset the first node in response to a first selection control signal and a display reset signal; the second selection reset circuit is connected to the second node, and is configured to reset the second node in response to a second selection control signal and the display reset signal; and the first selection control signal and the second selection control signal are inversion signals to each other.

For example, in the shift register unit provided by an embodiment of the present disclosure, the first input circuit is connected to the first node, and the first input circuit is configured to receive a first clock signal and take the first clock signal as the first input signal, and to charge the first node with the first clock signal under control of the first clock signal.

For example, in the shift register unit provided by an embodiment of the present disclosure, the second input circuit is connected to the second node, and the second input circuit is configured to receive the second input signal and a first voltage, and to charge the second node with the first voltage under control of the second input signal.

For example, in the shift register unit provided by an embodiment of the present disclosure, the output circuit is connected to the first node and the second node, and the output circuit is configured to receive a second clock signal, and to output the second clock signal as the output signal to the output terminal under the common control of the level of the first node and the level of the second node.

For example, in the shift register unit provided by an embodiment of the present disclosure, the first selection reset circuit is configured to receive a second voltage, and to reset the first node with the second voltage under control of the first selection control signal and the display reset signal; and the second selection reset circuit is configured to receive a third voltage, and to reset the second node with the third voltage under control of the second selection control signal and the display reset signal.

For example, in the shift register unit provided by an embodiment of the present disclosure, the first input circuit includes a first transistor and a first capacitor. A gate electrode of the first transistor is connected to a first electrode of the first transistor, and is configured to receive the first clock signal, and a second electrode of the first transistor is connected to the first node; and a first electrode of the first capacitor is connected to the first node, and a second electrode of the first capacitor is configured to receive a second voltage.

For example, in the shift register unit provided by an embodiment of the present disclosure, the second input circuit includes a second transistor. A gate electrode of the second transistor is configured to receive the second input signal, a first electrode of the second transistor is configured to receive the first voltage, and a second electrode of the second transistor is connected to the second node.

For example, in the shift register unit provided by an embodiment of the present disclosure, the output terminal includes a first signal output terminal and a second signal output terminal, the first signal output terminal and the second signal output terminal are configured to output the output signal, and the output circuit includes a third transistor, a fourth transistor, a fifth transistor, and a second capacitor; a gate electrode of the third transistor is connected to the first node, a first electrode of the third transistor is configured to receive the second clock signal, and a second electrode of the third transistor is connected to a first electrode of the fourth transistor; a gate electrode of the fourth transistor is connected to the second node, and a second electrode of the fourth transistor is connected to the first signal output terminal; a gate electrode of the fifth transistor is connected to the second node, a first electrode of the fifth transistor is connected to the second electrode of the third transistor, and a second electrode of the fifth transistor is connected to the second signal output terminal; and a first electrode of the second capacitor is connected to the second node, and a second electrode of the second capacitor is connected to the first signal output terminal.

For example, in the shift register unit provided by an embodiment of the present disclosure, the output terminal further includes a third signal output terminal, and the output circuit further includes a nineteenth transistor and a twentieth transistor, a gate electrode of the nineteenth transistor is connected to the first node, a first electrode of the nineteenth transistor is configured to receive a third clock signal, and a second electrode of the nineteenth transistor is connected to a first electrode of the twentieth transistor; and a gate electrode of the twentieth transistor is connected to the second node, and a second electrode of the twentieth transistor is connected to the third signal output terminal.

For example, in the shift register unit provided by an embodiment of the present disclosure, the first selection reset circuit includes a sixth transistor and a seventh transistor. A gate electrode of the sixth transistor is configured to receive the first selection control signal, a first electrode of the sixth transistor is connected to the first node, and a second electrode of the sixth transistor is connected to a first electrode of the seventh transistor; and a gate electrode of the seventh transistor is configured to receive the display reset signal, and a second electrode of the seventh transistor is configured to receive the second voltage.

For example, in the shift register unit provided by an embodiment of the present disclosure, the second selection reset circuit includes an eighth transistor and a ninth transistor. A gate electrode of the eighth transistor is configured to receive the display reset signal, a first electrode of the eighth transistor is connected to the second node, and a second electrode of the eighth transistor is connected to a first electrode of the ninth transistor; and a gate electrode of the ninth transistor is configured to receive the second selection control signal, and a second electrode of the ninth transistor is configured to receive the third voltage.

For example, the shift register unit provided by an embodiment of the present disclosure further includes a first control circuit and a first reset circuit. The output terminal includes a first signal output terminal and a second signal output terminal, the first signal output terminal and the second signal output terminal are configured to output the output signal; the first control circuit is configured to control a level of a third node under control of the level of the second node; and the first reset circuit is configured to reset the second node, the first signal output terminal and the second signal output terminal under control of the level of the third node.

For example, in the shift register unit provided by an embodiment of the present disclosure, the first control circuit includes a tenth transistor, an eleventh transistor, and a twelfth transistor. A gate electrode of the tenth transistor is connected to a first electrode of the tenth transistor, and is configured to receive a fourth voltage, and a second electrode of the tenth transistor is connected to a third node; a gate electrode of the eleventh transistor is connected to a first electrode of the eleventh transistor, and is configured to receive a fifth voltage, and a second electrode of the eleventh transistor is connected to the third node; and a gate electrode of the twelfth transistor is connected to the second node, a first electrode of the twelfth transistor is connected to the third node, and a second electrode of the twelfth transistor is configured to receive the third voltage.

For example, in the shift register unit provided by an embodiment of the present disclosure, the first reset circuit includes a thirteenth transistor, a fourteenth transistor, and a fifteenth transistor. A gate electrode of the thirteenth transistor is connected to the third node, a first electrode of the thirteenth transistor is connected to the second node, and a second electrode of the thirteenth transistor is configured to receive the third voltage; a gate electrode of the fourteenth transistor is connected to the third node, a first electrode of the fourteenth transistor is connected to the first signal output terminal, and a second electrode of the fourteenth transistor is configured to receive the third voltage; and a gate electrode of the fifteenth transistor is connected to the third node, a first electrode of the fifteenth transistor is connected to the second signal output terminal, and a second electrode of the fifteenth transistor is configured to receive a sixth voltage.

For example, in the shift register unit provided by an embodiment of the present disclosure, the first reset circuit further includes a twenty-first transistor, and the output terminal further includes a third signal output terminal. A gate electrode of the twenty-first transistor is connected to the third node, a first electrode of the twenty-first transistor is connected to the third signal output terminal, and a second electrode of the twenty-first transistor is configured to receive a seventh voltage.

For example, the shift register unit provided by an embodiment of the present disclosure further includes a second control circuit, the second control circuit is configured to control the level of the third node in response to the second input signal.

For example, in the shift register unit provided by an embodiment of the present disclosure, the second control circuit includes a sixteen transistor. A gate electrode of the sixteenth transistor is configure to receive the second input signal, a first electrode of the sixteenth transistor is connected to the third node, and a second electrode of the sixteenth transistor is configure to receive the third voltage.

For example, the shift register unit provided by an embodiment of the present disclosure further includes a second reset circuit and a third reset circuit. The second reset circuit is configured to reset the first node in response to a global reset signal; and the third reset circuit is configured to reset the second node in response to the global reset signal.

For example, in the shift register unit provided by an embodiment of the present disclosure, the second reset circuit includes a seventeenth transistor, and the third reset circuit includes an eighteenth transistor. A gate electrode of the seventeenth transistor is configured to receive the global reset signal, a first electrode of the seventeenth transistor is connected to the first node, and a second electrode of the seventeenth transistor is configured to receive an eighth voltage; and a gate electrode of the eighteenth transistor is configured to receive the global reset signal, a first electrode of the eighteenth transistor is connected to the second node, and a second electrode of the eighteenth transistor is configured to receive a third voltage.

For example, in the shift register unit provided by an embodiment of the present disclosure, the first input circuit includes a first transistor and a first capacitor, a gate electrode of the first transistor is connected to a first electrode of the first transistor, and is configured to receive a first clock signal, and a second electrode of the first transistor is connected to the first node; a first electrode of the first capacitor is connected to the first node, and a second electrode of the first capacitor is configured to receive a second voltage; the second input circuit includes a second transistor, a gate electrode of the second transistor is configured to receive the second input signal, a first electrode of the second transistor is configured to receive a first voltage, and a second electrode of the second transistor is connected to the second node; the output terminal includes a first signal output terminal and a second signal output terminal, the first signal output terminal and the second signal output terminal are configured to output the output signal, and the output circuit includes a third transistor, a fourth transistor, a fifth transistor, and a second capacitor; a gate electrode of the third transistor is connected to the first node, a first electrode of the third transistor is configured to receive the second clock signal, and a second electrode of the third transistor is connected to a first electrode of the fourth transistor; a gate electrode of the fourth transistor is connected to the second node, and a second electrode of the fourth transistor is connected to the first signal output terminal; a gate electrode of the fifth transistor is connected to the second node, a first electrode of the fifth transistor is connected to the second electrode of the third transistor, and a second electrode of the fifth transistor is connected to the second signal output terminal; a first electrode of the second capacitor is connected to the second node, and a second electrode of the second capacitor is connected to the first signal output terminal; the first selection reset circuit includes a sixth transistor and a seventh transistor; a gate electrode of the sixth transistor is configured to receive the first selection control signal, a first electrode of the sixth transistor is connected to the first node, and a second electrode of the sixth transistor is connected to a first electrode of the seventh transistor; a gate electrode of the seventh transistor is configured to receive the display reset signal, and a second electrode of the seventh transistor is configured to receive the second voltage; the second selection reset circuit includes an eighth transistor and a ninth transistor; a gate electrode of the eighth transistor is configured to receive the display reset signal, a first electrode of the eighth transistor is connected to the second node, and a second electrode of the eighth transistor is connected to a first electrode of the ninth transistor; a gate electrode of the ninth transistor is configured to receive the second selection control signal, and a second electrode of the ninth transistor is configured to receive a third voltage; the shift register unit further includes a tenth transistor, an eleventh transistor, a twelfth transistor, a thirteenth transistor, a fourteenth transistor, a fifteenth transistor, a sixteenth transistor, a seventeenth transistor, and an eighteenth transistor; a gate electrode of the tenth transistor is connected to a first electrode of the tenth transistor, and is configured to receive a fourth voltage, and a second electrode of the tenth transistor is connected to a third node; a gate electrode of the eleventh transistor is connected to a first electrode of the eleventh transistor, and is configured to receive a fifth voltage, and a second electrode of the eleventh transistor is connected to the third node; a gate electrode of the twelfth transistor is connected to the second node, a first electrode of the twelfth transistor is connected to the third node, and a second electrode of the twelfth transistor is configured to receive the third voltage; a gate electrode of the sixteenth transistor is configure to receive the second input signal, a first electrode of the sixteenth transistor is connected to the third node, and a second electrode of the sixteenth transistor is configure to receive the third voltage; a gate electrode of the thirteenth transistor is connected to the third node, a first electrode of the thirteenth transistor is connected to the second node, and a second electrode of the thirteenth transistor is configured to receive the third voltage; a gate electrode of the fourteenth transistor is connected to the third node, a first electrode of the fourteenth transistor is connected to the first signal output terminal, and a second electrode of the fourteenth transistor is configured to receive the third voltage; a gate electrode of the fifteenth transistor is connected to the third node, a first electrode of the fifteenth transistor is connected to the second signal output terminal, and a second electrode of the fifteenth transistor is configured to receive a sixth voltage; a gate electrode of the seventeenth transistor is configured to receive a global reset signal, a first electrode of the seventeenth transistor is connected to the first node, and a second electrode of the seventeenth transistor is configured to receive an eighth voltage; and a gate electrode of the eighteenth transistor is configured to receive the global reset signal, a first electrode of the eighteenth transistor is connected to the second node, and a second electrode of the eighteenth transistor is configured to receive the third voltage.

At least one embodiment of the present disclosure further provides a gate drive circuit, which includes a plurality of cascaded shift register units, each of which is provided by any one of the above embodiments of the present disclosure.

For example, the gate drive circuit provided by an embodiment of the present disclosure further includes a first sub-clock signal line, a second sub-clock signal line, a third sub-clock signal line, a fourth sub-clock signal line, a fifth sub-clock signal line, and a sixth sub-clock signal line. An output circuit of a (2n−1)-th stage of shift register unit is connected to the first sub-clock signal line to receive a clock signal of the first sub-clock signal line and to output the clock signal, as an output signal of the (2n−1)-th stage of shift register unit, of the first sub-clock signal line; and an output circuit of a 2n-th stage of shift register unit is connected to the second sub-clock signal line to receive a clock signal of the second sub-clock signal line and outputs the clock signal, as an output signal of the 2n-th stage of shift register unit, of the second sub-clock signal line; respective stages of shift register units are connected to the third sub-clock signal line to receive a first clock signal; the respective stages of shift register units are connected to the fourth sub-clock signal line to receive a global reset signal; the respective stages of shift register units are connected to the fifth sub-clock signal line to receive the first selection control signal; and the respective stages of shift register units are connected to the sixth sub-clock signal line to receive the second selection control signal, n is an integer greater than zero.

At least one embodiment of the present disclosure further provide a display device, which includes the gate drive circuit provided by any one of the above embodiments of the present disclosure.

At least one embodiment of the present disclosure further provided a drive method of the shift register unit, which includes a display phase and a blanking phase of one frame. In the display phase, in response to the first input signal, charging the first node by the first input circuit, in response to the second input signal, charging the second node by the second input circuit, and under the common control of the level of the first node and the level of the second node, outputting the output signal to the output terminal by the output circuit; and in the blanking phase, in response to the first input signal, charging the first node by the first input circuit, and under the common control of the level of the first node and the level of the second node, outputting the output signal to the output terminal by the output circuit.

At least one embodiment of the present disclosure further provided a drive method of the shift register unit, which includes a display phase and a blanking phase of one frame, in a case where each stage of shift register unit includes a first selection reset circuit and a second selection reset circuit, the drive method including:

in the display phase, in response to a first selection control signal and a display reset signal, resetting a first node of an m-th stage of shift register unit by a first selection reset circuit of the m-th stage of shift register unit; and in response to a second selection control signal and the display reset signal, resetting second nodes of other stages of shift register units other than the m-th stage of shift register unit by second selection reset circuits of other stages of shift register units other than the m-th stage shift register unit;

in the blanking phase, in response to the first input signal, charging the first node of the m-th stage of shift register unit by a first input circuit of the m-th stage of shift register unit; and m is an integer greater than zero.

BRIEF DESCRIPTION OF THE DRAWINGS

In order to clearly illustrate the technical solutions of the embodiments of the disclosure, the drawings of the embodiments will be briefly described in the following; and it is obvious that the described drawings are only related to some embodiments of the disclosure and thus are not limitative to the disclosure.

FIG. 9 is a drive method of a gate drive circuit provided by at least one embodiment of the present disclosure; and FIG. 10 is a drive method of another gate drive circuit provided by at least one embodiment of the present disclosure.

DETAILED DESCRIPTION

Figure 1:
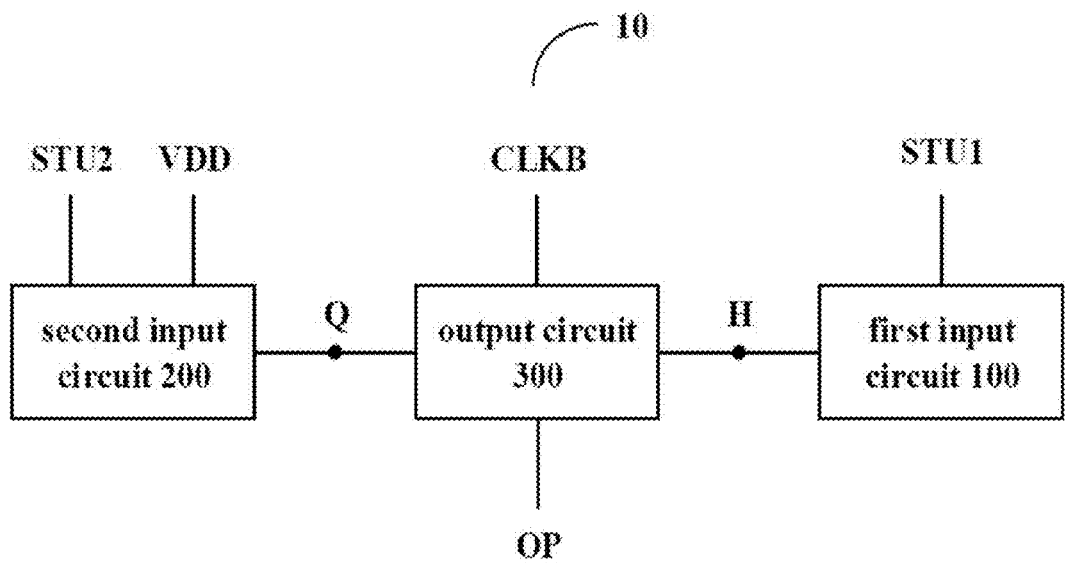
FIG. 1 is a schematic diagram of a shift register unit provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an" or "the" etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for example, in a case where respective circuits are implemented as N-type transistors, the term "pull-up" means charging a node or an electrode of a transistor so as to raise an absolute value of a level of the node or a level of the electrode, thereby implementing an operation (e.g., turn-on) of a corresponding transistor; and the term "pull-down" means discharging a node or an electrode of a transistor, so that an absolute value of a level of the node or the electrode is decreased, thereby implementing an operation (e.g., turn-off) of the corresponding transistor.

For another example, in a case where respective circuits are implemented as P-type transistors, the term "pull-up" means discharging a node or an electrode of a transistor, so that an absolute value of a level of the node or the electrode is decreased, thereby achieving an operation (e.g., turn-on) of a corresponding transistor; and the term "pull-down" means charging a node or an electrode of a transistor, so that an absolute value of a level of the node or the electrode is increased, thereby achieving an operation (e.g., turn-off) of a corresponding transistor.

In addition, specific meanings of the terms "pull-up" and "pull-down" will further be adjusted accordingly depending on specific types of transistors used, as long as the control of the transistors can be realized to realize a corresponding switching function.

At present, the gate drive circuit of OLED usually includes three sub-circuits, that is, a detection circuit, a display circuit, and a connection circuit (or a gate circuit) outputting a composite pulse of the detection circuit and the display circuit. The circuit structure of the gate drive circuit of OLED is very complicated and cannot satisfy requirements of a high resolution and a narrow border.

In a case where sub-pixel units in a OLED display panel is compensated, in addition to performing internal compensation by providing a pixel compensation circuit in the sub-pixel units, external compensation can further be performed by providing a sensing transistor. In a case where the external compensation is performed, a gate drive circuit including a shift register unit needs to provide drive signals for a scanning transistor and the sensing transistor to the sub-pixel units in the display panel, respectively. For example, a scanning drive signal for the scanning transistor is provided in a display phase of one frame, and a sensing drive signal for the sensing transistor is provided in a blanking phase of one frame.

In another external compensation method, the sensing drive signal outputted by the gate drive circuit is sequentially scanned row by row. For example, in a blanking phase of a first frame, the sensing drive signal for a first row of sub-pixel units in the display panel is output, in a blanking phase of a second frame, the sensing drive signal for a second row of sub-pixel units in the display panel is output, and so on. Sensing drive signals of respective rows of sub-pixel units are output row by row in sequence at a frequency of outputting the sensing drive signal corresponding to one row of sub-pixel units per frame, that is, row by row sequential compensation of the display panel is completed.

However, following problems of display defects may occur in a case where the above-mentioned row by row sequential compensation method is adopted: first, during a process of scanning and displaying of a plurality of frames of images, there is a scanning line moving row by row in the display panel; and second, due to a difference in time point of the external compensation, a brightness difference in different regions of the display panel may be relatively large.

For example, in a case where the external compensation is performed on sub-pixel units in a 100-th row of the display panel, although the external compensation is performed on sub-pixel units in a 10-th row of the display panel, a light emission brightness of the sub-pixel units in the 10-th row may be changed in this case. For example, the light emission brightness is decreased, thereby causing uneven brightness in different regions of the display panel, and this problem is more noticeable in a large size display panel.

For the above problems, at least one embodiment of the present disclosure provides a shift register unit, which includes a first input circuit, a second input circuit, and an output circuit. The first input circuit is configured to charge a first node in response to a first input signal to control a level of the first node; the second input circuit is configured to charge a second node in response to a second input signal to control a level of the second node; and the output circuit is configured to output an output signal to an output terminal under common control of the level of the first node and the level of the second node. The embodiments of the present disclosure further provide a gate drive circuit, a display device and a drive method corresponding to the shift register unit described above.

The shift register unit, the gate drive circuit, the display device and the drive method provided by the embodiments of the present disclosure, can further realize a random compensation under a premise of realizing row by row sequential compensation (for example, the row by row sequential compensation is required in shutdown detection), so that poor display problems, such as scanning lines and uneven display brightness caused by the row by row sequential compensation, can be avoided.

It should be noted that, in the embodiments of the present disclosure, the random compensation refers to an external compensation method different from the row by row sequential compensation. Adopting the random compensation can randomly output sensing drive signals corresponding to sub-pixel units in any one of rows in the display panel in a blanking phase of a certain frame. The sub-pixel units in any one of rows are randomly selected, and the following embodiments are identical to the described above and will not be described again.

In addition, in the embodiments of the present disclosure, for the purpose of explanation, "a frame", "every frame" or "a certain frame" is defined to include a display phase and a blanking phase that are sequentially performed. For example, in the display phase, the gate drive circuit outputs a drive signal which can drive the display panel to complete a scanning display of a complete image from a first row to a last row (that is, the scanning display of a frame of image). In the blanking phase, the gate drive circuit outputs a drive signal that can be configured to drive sensing transistors in a row of the sub-pixel units in the display panel, for example, to extract electrical parameters (for example, to extract threshold voltages of transistors), and then, the external compensation is performed on the row of the sub-pixel units according to the electrical parameters.

The embodiments of the present disclosure and examples thereof will be described in detail below with reference to the accompanying drawings.

At least one embodiment of the present disclosure provides a shift register unit 10. As shown in FIG. 1, the shift register unit 10 includes a first input circuit 100, a second input circuit 200, and an output circuit 300. A plurality of shift register units 10 may be cascaded to construct a gate drive circuit, which can be configured to drive a display operation of a display panel, according to an embodiment of the present disclosure, thereby allowing the display panel to display a frame of image and perform an external compensation operation, for example, by a row by row scanning method.

The first input circuit 100 is configured to charge a first node H in response to a first input signal STU1 to control a level of the first node H.

For example, as shown in FIG. 1, the first input circuit 100 is connected to the first node H, and is configured to receive the first input signal STU1. In a case where the first input circuit 100 is turned on under control of the first input signal STU1, the first node H may be charged simultaneously with the first input signal STU1, or the first input signal STU1 is taken as a switching signal and the first node H is charged by another voltage source to pull-up the level of the first node H, thereby controlling the level of the first node H. For example, a capacitor may be provided in the first input circuit 100, and the capacitor may be used to maintain the level of the first node H. For example, in some embodiments, the first input circuit 100 is configured to receive a first clock signal CLKA and take the first clock signal CLKA as the first input signal STU1, so that in a case where the first input circuit 100 is turned on, the first node H can be charged with the first clock signal CLKA.

The second input circuit 200 is configured to charge a second node Q in response to a second input signal STU2 to control a level of the second node Q.

For example, as shown in FIG. 1, the second input circuit 200 and the second node Q are connected. In some embodiments, the second input circuit 200 is configured to receive the second input signal STU2 and a first voltage VDD. In a case where the second input circuit 200 is turned on under control of the second input signal STU2, the second node Q may be charged with the first voltage VDD to pull-up the level of the second node Q, thereby controlling the level of the second node Q.

For example, in a case where the gate drive circuit includes a plurality of cascaded shift register units 10, in addition to previous stages of shift register units (for example, a first stage, etc.), a second input circuit 200 of other stages of shift register units 10 may be connected to output terminals OP of adjacent stages (for example, a previous stage) of shift register units 10 to receive an output signal, thereby taking the output signal as the second input signal STU2 of a present stage. For the shift register units in the previous stages (e.g., first stage, etc.), the shift register units may be connected to a separate signal line to receive the second input signal STU2.

It should be noted that, in the embodiments of the present disclosure, the first voltage VDD is, for example, a high level, and the following embodiments are the same as described above, and are not described again.

In addition, it should be noted that in the embodiments of the present disclosure, the high level and the low level are relative. The high level represents a higher voltage range (for example, the high level may adopt 5V, 10V or other suitable voltages), and a plurality of high levels may be the same or different. Similarly, the low level represents a lower voltage range (for example, the low level may adopt 0V, −5V, −10V or other suitable voltages), and a plurality of low levels may be the same or different. For example, a minimum value of the high level is greater than a maximum value of the low level.

In the embodiments of the present disclosure, charging a node (for example, the first node H and the second node Q) represents that the node is electrically connected to a voltage signal at a high level, so that the level of the node is pull-up by the voltage signal at a high level. For example, a capacitor electrically connected to the node may be provided, and charging the node represents to charge the capacitor electrically connected to the node.

The output circuit 300 is configured to output an output signal to an output terminal OP under the common control of the level of the first node H and the level of the second node Q.

For example, as shown in FIG. 1, the output circuit is connected to the first node H and the second node Q, respectively. In some embodiments, the output circuit 300 is configured to receive a second clock signal CLKB, and the second clock signal CLKB may be output, as an output signal, to the output terminal OP, in a case where the output circuit 300 is turned on under the common control of the level of the first node H and the level of the second node Q.

In the shift register unit 10 provided by the embodiments of the present disclosure, for example, in a display phase of one frame, the first input circuit 100 may charge the first node H in response to the first input signal STU1 to pull up the level of the first node H. The second input circuit 200 may charge the second node Q in response to the second input signal STU2 to pull up the level of the second node Q. In a case where the level of the first node H and the level of the second node Q are both high levels, the output circuit 300 is turned on, so that the second clock signal CLKB, which is received, can be output, as the output signal, to the output terminal OP. The output signal can, for example, drive a row of sub-pixel units in the display panel to display.

For example, in a case where the shift register unit 10 needs to output a drive signal in a blanking phase of one frame, a high level of the second node Q of the shift register unit 10 can be maintained from the display phase of one frame to the blanking phase of one frame.

In the blanking phase of one frame, at first, the first input circuit 100 may charge the first node H in response to the first input signal STU1 to pull up the level of the first node H. The output circuit 300 is turned on under the common control of a high level of the first node H and the high level of the second node Q. Then, in a case where a drive signal is needed to be output, the second clock signal CLKB at a high level is provided, and the output circuit 300 which is turned on outputs the second clock signal CLKB, as an output signal, to the output terminal OP. The output signal can, for example, drive a row of sub-pixel units in the display panel for the external compensation.

A plurality of shift register units 10 provided by the embodiments of the present disclosure can be cascaded to construct a gate drive circuit that can drive a display panel for the external compensation. For example, the gate drive circuit can drive the display panel to realize the row by row sequential compensation. In the first frame, the gate drive circuit outputs a drive signal configured to drive the first row of sub-pixel units, in the second frame, the gate drive circuit outputs a drive signal configured drive the second row of sub-pixel units, and so on, thus completing the row by row sequential compensation of the display panel.

For example, the gate drive circuit can further drive a display panel to realize the random compensation. For example, in a certain frame, the gate drive circuit may output a drive signal configured to any row of sub-pixel units. The any row of sub-pixel units are randomly selected, thus realizing the random compensation for the display panel.

As described above, the shift register unit 10 provided in the embodiments of the present disclosure can output a drive signal not only in the display phase but also in the blanking phase, so that the random compensation can be realized under a premise of realizing the row by row sequential compensation (for example, the row by row sequential compensation is required in shutdown detection), thereby avoiding the poor display problems, such as scanning lines and uneven display brightness caused by the row by row sequential compensation.

Figure 2:
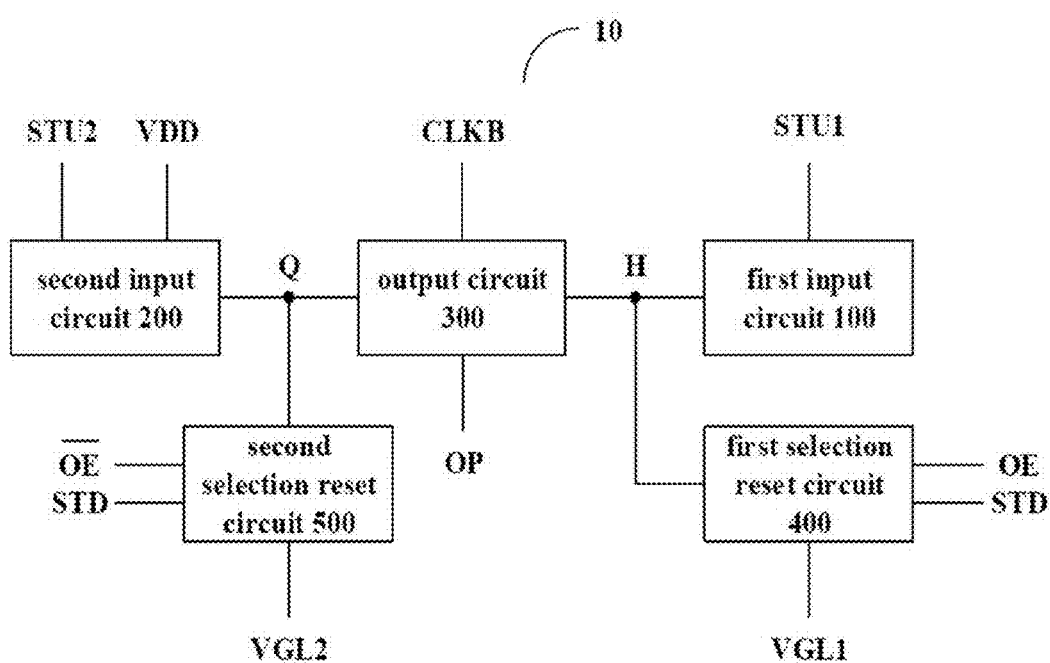
FIG. 2 is a schematic diagram of another shift register unit provided by at least one embodiment of the present disclosure.

In some embodiments, as shown in FIG. 2, the shift register unit 10 further includes a first selection reset circuit 400 and a second selection reset circuit 500.

The first selection reset circuit 400 is connected to the first node H, and is configured to reset the first node H in response to a first selection control signal OE and a display reset signal STD.

For example, as shown in FIG. 2, the first selection reset circuit 400 is configured to receive a second voltage VGL1. In a case where the first selection reset circuit 400 is turned on under control of the first selection control signal OE and the display reset signal STD, the first node H may be reset by the second voltage VGL1.

The second selection reset circuit 500 is connected to the second node Q, and is configured to reset the second node Q in response to a second selection control signal $\overline{OE}$ and the display reset signal STD.

For example, as shown in FIG. 2, the second selection reset circuit 500 is configured to receive a third voltage VGL2. In a case where the second selection reset circuit 500 is turned on under control of the second selection control signal $\overline{OE}$ and the display reset signal STD, the second node Q can be reset by the third voltage VGL2.

In the embodiments of the present disclosure, the first selection control signal OE and the second selection control signal $\overline{OE}$ are inverted signals to each other. It should be noted that, the first selection control signal OE and the second selection control signal $\overline{OE}$ are inverted signals to each other, which represents that in a case where the first selection control signal OE is at a high level, the second selection control signal $\overline{OE}$ is at a low level and in a case where the first selection control signal OE is at a low level, the second selection control signal $\overline{OE}$ is at a high level.

In addition, in the embodiments of the present disclosure, the first selection control signal OE and the second selection control signal $\overline{OE}$ may be provided by a control circuit. For example, in an example, the control circuit may be implemented as an FPGA (Field Programmable Gate Array) device or other signal generation circuit. For example, in an example, the control circuit may provide the first selection control signal OE, and then a second selection control signal $\overline{OE}$ may be obtained after the first selection control signal OE being outputted by an inverter.

For example, in a case where a plurality of shift register units 10 are cascaded to construct a gate drive circuit, in addition to later stages of shift register units (for example, a last stage, etc.), other stages of shift register units 10 may be connected to output terminals OP of adjacent stages of shift register units 10 (for example, a next stage) to receive an output signal, thereby taking the output signal as the display reset signal STD of the present stage. For the later stages of the shift register units (for example, the last stage, etc.), the later stages of shift register units may be connected to a separate signal line to receive the display reset signal STD.

It should be noted that in the embodiments of the present disclosure, the second voltage VGL1 and the third voltage VGL2 are, for example, at low levels. For example, in some examples, the second voltage VGL1 and the third voltage VGL2 may be the same, for example, both of the second voltage VGL1 and the third voltage VGL2 are −10V. As another example, in other examples, the second voltage VGL1 and the third voltage VGL2 may further be different. For example, the second voltage VGL1 is −6V and the third voltage VGL2 is −10V. The following embodiments are the same as described above and will not be described again.

In the shift register unit provided by the embodiments of the present disclosure, the level of the first node H and the level of the second node Q can be better controlled by setting the first selection reset circuit 400 and the second selection reset circuit 500, thereby realizing the random compensation. For example, in a case where the display reset signal STD is at a high level, because the first selection control signal OE and the second selection control signal $\overline{OE}$ are inverted signals to each other, only one of the first selection reset circuit 400 and the second selection reset circuit 500 is turned on, and the random compensation can be realized by the above arrangement.

For example, the shift register units 10 provided in the embodiments of the present disclosure are cascaded to construct a gate drive circuit. The gate drive circuit may drive a display panel to perform the random compensation. For example, in a case where a fifth row of sub-pixel units are needed to be drive in the display panel in the blanking phase of a certain frame, a fifth stage of shift register unit in the gate drive circuit may perform the following operations.

In the display phase of the frame, after the fifth stage of shift register units completes the output of the output signal, the level of the first selection control signal OE can be at a high level (the display reset signal STD is further at a high level in this case), so that the first selection reset circuit 400 is turned on and the level of the first node H is pulled down. The output circuit 300 is prevented from being turned on in this case in a subsequent phase of the display phase of the frame, so that display abnormality can be prevented from occurring. Meanwhile, in the display phase of the frame, in a case where the first selection control signal OE is at a high level, the second selection control signal is at a low level, so that the second selection reset circuit 500 is not turned on at this phase, so that the second node Q of the fifth stage of shift register unit is not reset. By adopting this method, the high level of the second node Q in the fifth stage of shift register unit can be maintained until entering the blanking phase of the frame.

In the blanking phase of the frame, at first, the first node H may be charged with the first input circuit 100 to pull up the level of the first node H, so that the output circuit 300 is turned on under the common control of the high level of the first node H and the high level of the second node Q. Then, in a case where a drive signal is needed to be output, a second clock signal CLKB at a high level is provided, and the output circuit 300, which is turned on, outputs the second clock signal CLKB as an output signal to the output terminal OP. The output signal can, for example, drive a row of sub-pixel units in the display panel for the external compensation. The Random compensation can be realized by adopting the above operations.

Figure 3:
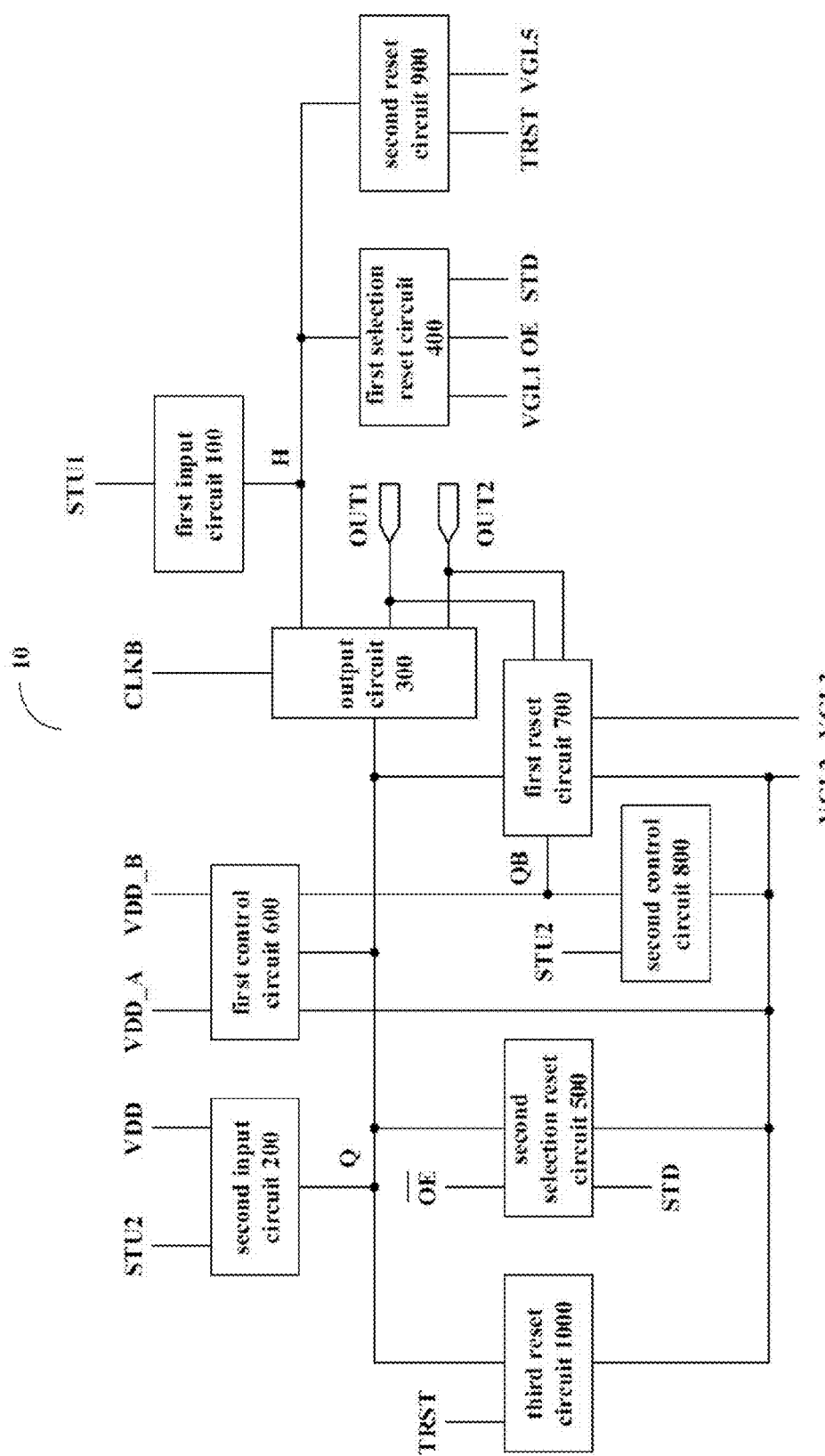
FIG. 3 is a schematic diagram of still another shift register unit provided by at least one embodiment of the present disclosure.

In some embodiments, as shown in FIG. 3, the shift register unit 10 may further include a first control circuit 600 configured to control a level of a third node QB under control of the level of the second node Q.

For example, as shown in FIG. 3, the first control circuit 600 is connected to the second node Q and the third node QB, and is configured to receive a fourth voltage VDD_A, a fifth voltage VDD_B, and the third voltage VGL2.

For example, in the embodiments of the present disclosure, the fourth voltage VDD_A and the fifth voltage VDD_B may be configured to be inverted signals to each other. That is, in a case where the fourth voltage VDD_A is at a high level, the fifth voltage VDD_B is at a low level. In a case where the fifth voltage VDD_B is at a high level, the fourth voltage VDD_A is at a low level. That is, one of the fourth voltage VDD_A and the fifth voltage VDD_B is guaranteed to be at a high level at the same time.

For example, in a case where the second node Q is at a high level, the first control circuit 600 may pull down the level of the third node QB with the third voltage VGL2 at a low level. As another example, in a case where the second node Q is at a low level, the first control circuit 600 may charge the third node QB with the fourth voltage VDD_A or the fifth voltage VDD_B to pull up the level of the third node QB to a high level.

In the embodiments of the present disclosure, the first control circuit 600 receives the fourth voltage VDD_A and the fifth voltage VDD_B, and ensures that one of the fourth voltage VDD_A and the fifth voltage VDD_B is at a high level. By adopting this method, the reliability of the circuit can be improved.

In some embodiments of the present disclosure, as shown in FIG. 3, the output terminal of the shift register unit 10 includes a first signal output terminal OUT1 and a second signal output terminal OUT2. The first signal output terminal OUT1 and the second signal output terminal OUT2 are configured to output the output signal. For example, in the display phase of a frame, a signal outputted by the first signal output terminal OUT1 may be provided, as the second input signal STU2, to other stages of shift register units 10, for example, to complete row by row shift of the display scanning. A signal outputted by the second signal output terminal OUT2 can, for example, drive a row of sub-pixel units in the display panel to perform the display scanning. For example, in some embodiments, a signal timing outputted by the first signal output terminal OUT1 and a signal timing outputted by the second signal output terminal OUT2 are the same. For another example, in the blanking phase of a frame, the signal outputted by the second signal output terminal OUT2 can be configured to drive a row of sub-pixel units in the display panel to complete the external compensation for the row of sub-pixel units.

In the shift register unit 10 provided in the embodiments of the present disclosure, a drive capability of the shift register unit 10 can be improved by providing two signal output terminals (OUT1 and OUT2).

In some embodiments, as shown in FIG. 3, the shift register unit 10 further includes a first reset circuit 700 configured to reset the second node Q, the first signal output terminal OUT1, and the second signal output terminal OUT2 under control of the level of the third node QB.

For example, as shown in FIG. 3, the first reset circuit 700 is connected to the third node QB, the second node Q, the first signal output terminal OUT1, and the second signal output terminal OUT2, and is configured to receive the third voltage VGL2 and the sixth voltage VGL3.

For example, in a case where the first reset circuit 700 is turned on under control of the level of the third node QB, the second node Q and the first signal output terminal OUT1 can be reset with the third voltage VGL2. Meanwhile, the second signal output terminal OUT2 can be reset with the sixth voltage VGL3.

It should be noted that in the embodiments of the present disclosure, the sixth voltage VGL3 is, for example, at a low level.

In addition, the first reset circuit 700 may reset the second signal output terminal OUT2 with the third voltage VGL2 instead of receiving the sixth voltage VGL3, the embodiments of the present disclosure is not limited to this case.

In some embodiments, as shown in FIG. 3, the shift register unit 10 may further include a second control circuit 800. The second control circuit 800 is configured to control the level of the third node QB in response to the second input signal STU2.

For example, as shown in FIG. 3, the second control circuit 800 is connected to the third node QB, and is configured to receive the second input signal STU2 and the third voltage VGL2. For example, in a case where the second control circuit 800 is turned on under control of the second input signal STU2, the level of the third node QB may be pulled down with the third voltage VGL2 at a low level. For example, in the display phase of a frame, in a case where the second control circuit 800 pulls down the level of the third node QB to a low level, an influence of the level of the third node QB on the level of the second node Q can be avoided, so that the second input circuit 200 charges the second node Q more fully in the display phase.

It should be noted that the description of the second input signal STU2 can refer to the corresponding description of the second input circuit 200 described above and will not be repeated here again.

In some embodiments, as shown in FIG. 3, the shift register unit further includes a second reset circuit 900 and a third reset circuit 1000.

The second reset circuit 900 is configured to reset the first node H in response to a global reset signal TRST. For example, as shown in FIG. 3, the second reset circuit 900 is connected to the first node H, and is configured to receive the global reset signal TRST and an eighth voltage VGL5. In a case where the second reset circuit 900 is turned on under control of the global reset signal TRST, the first node H may be reset with the eighth voltage VGL5. It should be noted that in the embodiments of the present disclosure, the eighth voltage VGL5 is, for example, at a low level.

The third reset circuit 1000 is configured to reset the second node Q in response to the global reset signal TRST. For example, as shown in FIG. 3, the third reset circuit 1000 is connected to the second node Q, and is configured to receive the global reset signal TRST and the third voltage VGL2. In a case where the third reset circuit 1000 is turned on under control of the global reset signal TRST, the second node Q can be reset with the third voltage VGL2 at a low level.

For example, in a case where a plurality of shift register units 10 are cascaded to construct a gate drive circuit, before the display phase of one frame, second reset circuits 900 and third reset circuits 1000 in respective stages of shift register units 10 are turned on in response to the global reset signal TRST to reset the first node H and the second node Q, thereby completing the global reset of the gate drive circuit.

It should be noted that in the embodiments of the present disclosure, for example, the second voltage VGL1, the third voltage VGL2, the sixth voltage VGL3, the eighth voltage VGL5, and a seventh voltage VGL4 mentioned below are all at a low level, and can be set to be the same, that is, the second voltage VGL1, the third voltage VGL2, the sixth voltage VGL3, the eighth voltage VGL5, and the seventh voltage VGL4 can be provided through the same signal line. As another example, two, three or four of the above five voltages may be set to be the same, and the same voltage is provided through the same signal line. As another example, any two of the above five voltages are different, that is, the five voltages need to be supplied through five different signal lines, respectively. The embodiments of the present disclosure do not limit the arrangement of the second voltage VGL1, the third voltage VGL2, the sixth voltage VGL3, the seventh voltage VGL4, and the eighth voltage VGL5.

In addition, it should be noted that in the embodiments of the present disclosure, respective nodes (the first node H, the second node Q, and the third node QB) are provided to better describe the circuit structure, and does not represent an actual component. The nodes represent junction points of connections of related circuits in the circuit structure, that is, the related circuits connected to the same node identification are electrically connected to each other. For example, as shown in FIG. 3, the first control circuit 600, the first reset circuit 700, and the second control circuit 800 are all connected to the third node QB, which represents that these circuits are electrically connected to each other.

Those skilled in the art can understand that although the shift register unit 10 in FIG. 3 shows the first control circuit 600, the first reset circuit 700, the second control circuit 800, the second reset circuit 900, and the third reset circuit 1000, the above examples do not limit the protection scope of the present disclosure. In a practical application, technician may choose to use or not to use one or more of the above circuits according to specific situation. Based on the principle that various combinations and variations of the above circuits do not depart from the present disclosure, the repetition will not be described again.

Figure 4:
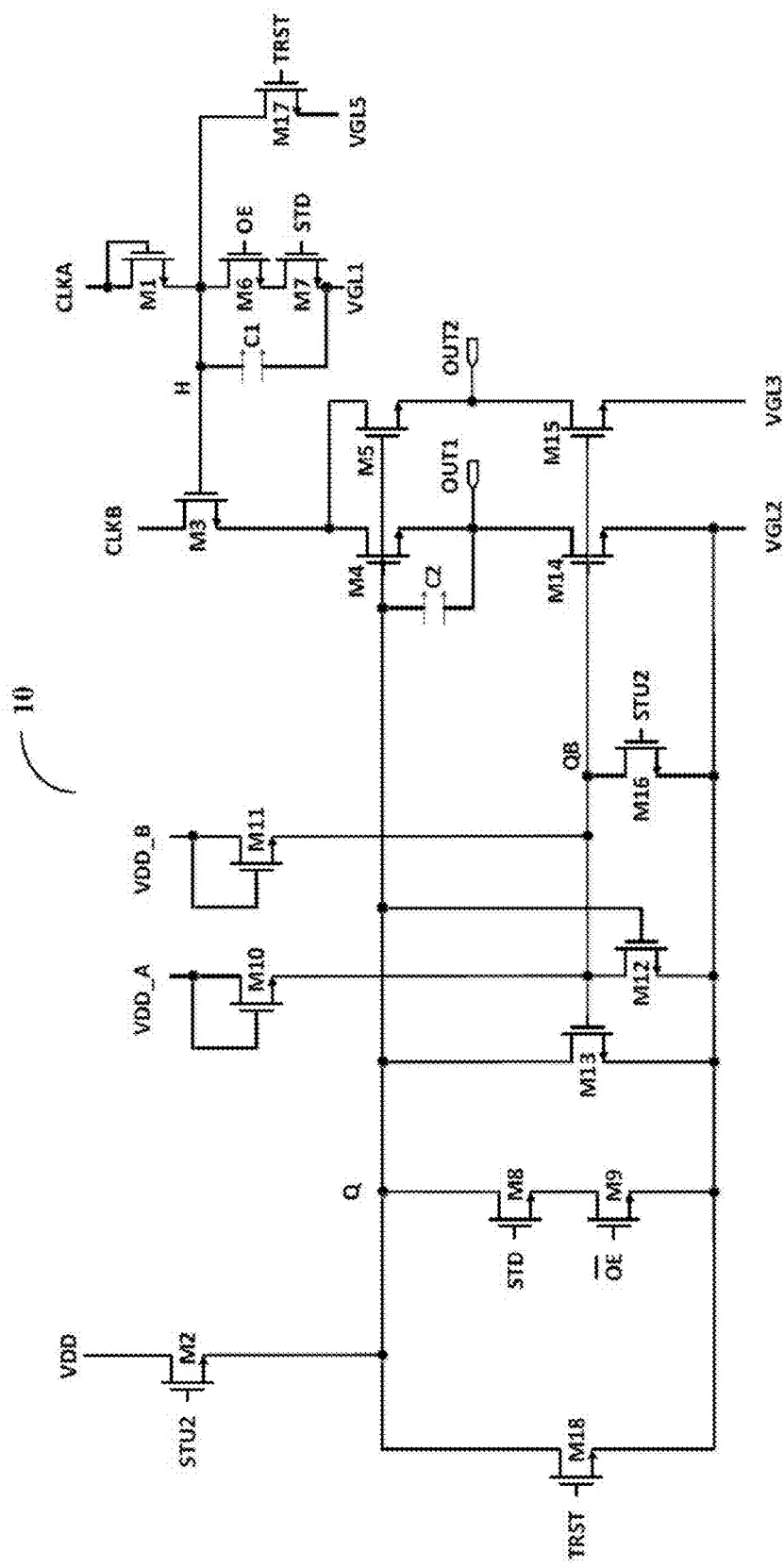
FIG. 4 is a circuit diagram of a shift register unit provided by at least one embodiment of the present disclosure.

In an embodiment of the embodiments of the present disclosure, the shift register unit 10 as shown in FIG. 3 may be implemented as a circuit structure as shown in FIG. 4. As shown in FIG. 4, the shift register unit 10 includes a first transistors M1 to an eighteenth transistor M18, a first capacitor C1, and a second capacitor C2. The output terminal OP includes a first signal output terminal OUT1 and a second signal output terminal OUT2, both of which can be used to output the above output signal. It should be noted that the transistors as shown in FIG. 4 are all described by taking N-type transistors as examples.

As shown in FIG. 4, the first input circuit may be implemented to include a first transistor M1 and a first capacitor C1. A gate electrode of the first transistor M1 is connected to a first electrode of the first transistor M1, and is configured to receive the first clock signal CLKA, and a second electrode of the first transistor M1 is connected to the first node H. For example, in a case where the first clock signal CLKA is at a high level, the first transistor M1 is turned on, so that the first node H can be charged with the first clock signal CLKA at a high level.

A first electrode of the first capacitor C1 is connected to the first node H, and a second electrode of the first capacitor C1 is configured to receive the second voltage VGL1. The level of the first node H can be maintained by providing the first capacitor C1. It should be noted that in the embodiments of the present disclosure, the second electrode of the first capacitor C1 may be directly grounded in addition to being configured to receive the second voltage VGL1, and the embodiments of the present disclosure is not limited to this case.

As shown in FIG. 4, the second input circuit 200 may be implemented to include a second transistor M2. A gate electrode of the second transistor M2 is configured to receive the second input signal STU2, a first electrode of the second transistor M2 is configured to receive the first voltage VDD, and a second electrode of the second transistor M2 is connected to the second node Q. For example, in a case where the second input signal STU2 is at a high level, the second transistor M2 is turned on, so that the second node Q can be charged with the first voltage VDD at a high level.

It should be noted that in the embodiments of the present disclosure, the second input circuit 200 may further adopt other implementations as long as corresponding functions can be realized, and the embodiments of the present disclosure is not limited to this case. For example, in another embodiment, the gate electrode and the first electrode of the second transistor M2 may further be configured to receive the second input signal STU2 at the same time, so that in a case where the second input signal STU2 is at a high level, the second node Q may be directly charged with the second input signal STU2 at a high level.

As shown in FIG. 4, the output circuit 300 may be implemented to include a third transistor M3, a fourth transistor M4, a fifth transistor M5, and a second capacitor C2.

A gate electrode of the third transistor M3 is connected to the first node H, a first electrode of the third transistor M3 is configured to receive the second clock signal CLKB, and a second electrode of the third transistor M3 is connected to a first electrode of the fourth transistor M4. A gate electrode of the fourth transistor M4 is connected to the second node Q, and a second electrode of the fourth transistor M4 is connected to the first signal output terminal OUT1.

A gate electrode of the fifth transistor M5 is connected to the second node Q, a first electrode of the fifth transistor M5 is connected to the second electrode of the third transistor M3, and a second electrode of the fifth transistor M5 is connected to the second signal output terminal OUT2. A first electrode of the second capacitor C2 is connected to the second node Q, and a second electrode of the second capacitor C2 is connected to the first signal output terminal OUT1.

For example, in a case where the level of the first node H and the level of the second node Q are both at a high level, the third transistor M3, the fourth transistor M4, and the fifth transistor M5 are turned on, so that the second clock signal CLKB received by the first electrode of the third transistor M3 can be output to the first signal output terminal OUT1 and the second signal output terminal OUT2. For example, the signal outputted by the first signal output terminal OUT1 may be supplied to other stages of shift register units to be used as the second input signal STU2, thereby completing row by row shift of the display scanning. The signal outputted by the second signal output terminal OUT2 can drive a row of sub-pixel units in the display panel to perform the display scanning or perform the external compensation.

As shown in FIG. 4, the first selection reset circuit 400 includes a sixth transistor M6 and a seventh transistor M7. A gate electrode of the sixth transistor M6 is configured to receive the first selection control signal OE, a first electrode of the sixth transistor M6 is connected to the first node H, and a second electrode of the sixth transistor M6 is connected to a first electrode of the seventh transistor M7. A gate electrode of the seventh transistor M7 is configured to receive the display reset signal STD, and a second electrode of the seventh transistor M7 is configured to receive the second voltage VGL1.

For example, in a case where both the first selection control signal OE and the display reset signal STD are at a high level, the sixth transistor M6 and the seventh transistor M7 are turned on, so that the first node H can be reset with the second voltage VGL1 at a low level, that is, charges stored in the first capacitor C1 can be released.

It should be noted that in the embodiments of the present disclosure, a setting position of the sixth transistor M6 and a setting position the seventh transistor M7 in the circuit can further be interchanged. That is, the gate electrode of the sixth transistor M6 is configured to receive the display reset signal STD, while the gate electrode of the seventh transistor M7 is configured to receive the first selection control signal OE, which can further realize the function of the first selection reset circuit 400.

As shown in FIG. 4, the second selection reset circuit 500 includes an eighth transistor M8 and a ninth transistor M9. A gate electrode of the eighth transistor M8 is configured to receive the display reset signal STD, a first electrode of the eighth transistor M8 is connected to the second node Q, and a second electrode of the eighth transistor M8 is connected to a first electrode of the ninth transistor M9. A gate electrode of the ninth transistor M9 is configured to receive the second selection control signal $\overline{OE}$, and a second electrode of the ninth transistor M9 is configured to receive the third voltage VGL2.

For example, in a case where both the second selection control signal $\overline{OE}$ and the display reset signal STD are at high levels, the eighth transistor M8 and the ninth transistor M9 are turned on, so that the second node Q can be reset with the third voltage VGL2 at a low level, that is, charges stored in the second capacitor C2 can be released.

It should be noted that in the embodiments of the present disclosure, a setting position of the eighth transistor M8 and a setting position of the ninth transistor M9 in the circuit can further be interchanged, that is, the gate electrode of the eighth transistor M8 is configured to receive the second selection control signal $\overline{OE}$, while the gate electrode of the ninth transistor M9 is configured to receive the display reset signal STD, which can further realize the function of the second selection reset circuit 500.

As shown in FIG. 4, the first control circuit 600 may be implemented to include a tenth transistor M10, an eleventh transistor M11, and a twelfth transistor M12. A gate electrode of the tenth transistor M10 is connected to a first electrode of the tenth transistor M10, and is configured to receive the fourth voltage VDD_A, and a second electrode of the tenth transistor M10 is connected to the third node QB. A gate electrode of the eleventh transistor M11 is connected to a first electrode of the eleventh transistor M11, and is configured to receive the fifth voltage VDD_B, and a second electrode of the eleventh transistor M11 is connected to the third node QB. A gate electrode of the twelfth transistor M12 is connected to the second node Q, a first electrode of the twelfth transistor M12 is connected to the third node QB, and a second electrode of the twelfth transistor M12 is configured to receive the third voltage VGL2.

As described above, the fourth voltage VDD_A and the fifth voltage VDD_B are configured to be inverted signals to each other, that is, in a case where the fourth voltage VDD_A is at a high level, the fifth voltage VDD_B is at a low level, and in a case where the fifth voltage VDD_B is at a high level, the fourth voltage VDD_A is at a low level. That is, only one transistor of the tenth transistor M10 and the eleventh transistor M11 is in a turn-on state, so that performance drift caused by a long-term conduction of transistors can be avoided, and the reliability of the shift register unit 10 is enhanced.

In a case where the tenth transistor M10 or the eleventh transistor M11 is turned on, the fourth voltage VDD_A or the fifth voltage VDD_B can charge the third node QB, so that the level of the third node QB becomes a high level. In a case where the level of the second node Q is a high level, the twelfth transistor M12 is turned on. For example, in the design of transistors, the twelfth transistor M12 and the tenth transistor M10 (or the eleventh transistor M11) may be configured to (for example, configuration for a size ratio, threshold voltages, etc. of the twelfth transistor M12 and the tenth transistor M10), in a case where both the twelfth transistor M12 and the tenth transistor M10 (or the eleventh transistor M11) are turned on, pull down the level of the third node QB to a low level. The low level may keep the thirteenth transistor M13, the fourteenth transistor M14, and the fifteenth transistor M15 in a turn-off state.

As shown in FIG. 4, the first reset circuit 700 includes a thirteenth transistor M13, a fourteenth transistor M14, and a fifteenth transistor M15. A gate electrode of the thirteenth transistor M13 is connected to the third node QB, a first electrode of the thirteenth transistor M13 is connected to the second node Q, and a second electrode of the thirteenth transistor M13 is configured to receive the third voltage VGL2. A gate electrode of the fourteenth transistor M14 is connected to the third node QB, a first electrode of the fourteenth transistor M14 is connected to the first signal output terminal OUT1, and a second electrode of the fourteenth transistor M14 is configured to receive the third voltage VGL2. A gate electrode of the fifteenth transistor M15 is connected to the third node QB, a first electrode of the fifteenth transistor M15 is connected to the second signal output terminal OUT2, and a second electrode of the fifteenth transistor M15 is configured to receive the sixth voltage VGL3.

For example, in a case where the third node QB is at a high level, the thirteenth transistor M13, the fourteenth transistor M14, and the fifteenth transistor M15 are turned on, so that the second node Q and the first signal output terminal OUT1 can be reset with the third voltage VGL2 at a low level, and the second signal output terminal OUT2 can be reset with the sixth voltage VGL3 at a low level.

As shown in FIG. 4, the second control circuit 800 may be implemented as a sixteenth transistor M16. A gate electrode of the sixteenth transistor M16 is configured to receive the second input signal STU2, a first electrode of the sixteenth transistor M16 is connected to the third node QB, and a second electrode of the sixteenth transistor M16 is configured to receive the third voltage VGL2.

For example, in a case where the second input signal STU2 is at a high level, the sixteenth transistor M16 is turned on, so that the third node QB can be reset with the third voltage VGL2 at a low level.

As shown in FIG. 4, the second reset circuit 900 may be implemented as a seventeenth transistor M17, and the third reset circuit 1000 may be implemented as an eighteenth transistor M18.

A gate electrode of the seventeenth transistor M17 is configured to receive the global reset signal TRST, a first electrode of the seventeenth transistor M17 is connected to the first node H, and a second electrode of the seventeenth transistor M17 is configured to receive the eighth voltage VGL5.

A gate electrode of the eighteenth transistor M18 is configured to receive the global reset signal TRST, a first electrode of the eighteenth transistor M18 is connected to the second node Q, and a second electrode of the eighteenth transistor M18 is configured to receive the third voltage VGL2.

For example, in a case where the global reset signal TRST is at a high level, the seventeenth transistor M17 and the eighteenth transistor M18 are turned on, so that the first node H can be reset with the eighth voltage VGL5 at a low level, meanwhile, the second node Q can be reset with the third voltage VGL2 at a low level, thereby realizing global reset.

Figure 5:
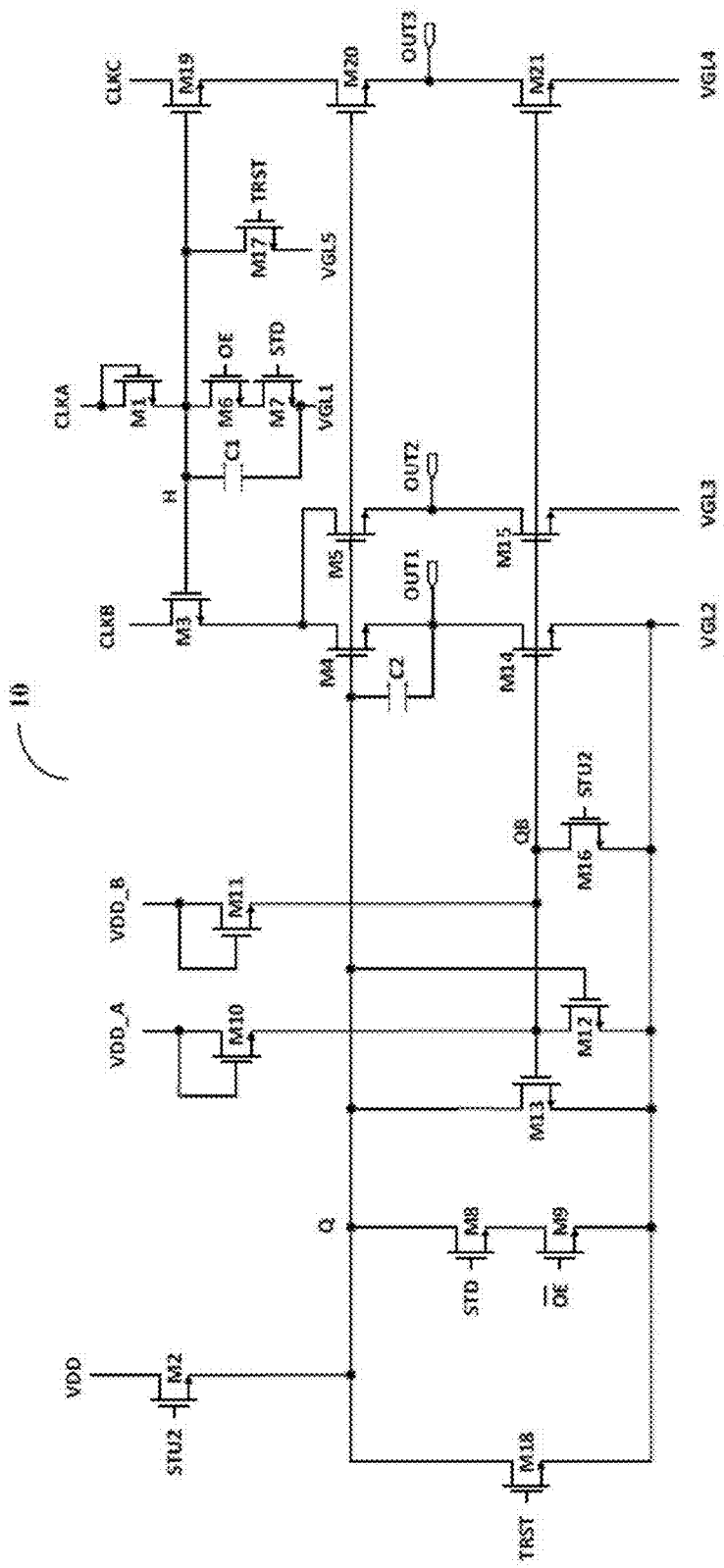
FIG. 5 is a circuit diagram of another shift register unit provided by at least one embodiment of the present disclosure.

As shown in FIG. 5, other embodiments of the present disclosure further provide a shift register unit 10. The shift register unit 10 as shown in FIG. 5 is compared with the shift register unit 10 as shown in FIG. 4. The output terminal OP further includes a third output terminal OUT3, the output circuit 300 further includes a nineteenth transistor M19 and a twentieth transistor M20, and correspondingly, the first reset circuit 700 further includes a twenty-first transistor M21.

A gate electrode of the nineteenth transistor M19 is connected to the first node H, a first electrode of the nineteenth transistor M19 is configured to receive a third clock signal CLKC, and a second electrode of the nineteenth transistor M19 is connected to a first electrode of the twentieth transistor M20. A gate electrode of the twentieth transistor M20 is connected to the second node Q, and a second electrode of the twentieth transistor M20 is connected to a third signal output terminal OUT3. A gate electrode of the twenty-first transistor M21 is connected to the third node QB, a first electrode of the twenty-first transistor M21 is connected to the third signal output terminal OUT3, and a second electrode of the twenty-first transistor M21 is configured to receive a seventh voltage VGL4. It should be noted that in the embodiments of the present disclosure, the seventh voltage VGL4 is, for example, at a low level.

For example, in a case where the first node H and the second node Q are at a high level, the nineteenth transistor M19 and the twentieth transistor M20 are turned on, so that the third clock signal CLKC received by the first electrode of the nineteenth transistor can be output to the third signal output terminal OUT3. For example, in a case where the third node QB is at a high level, the twenty-first transistor M21 is turned on, so that the third signal output terminal OUT3 can be reset with the seventh voltage VGL4 at a low level.

For example, in an example, the third clock signal CLKC received by the shift register unit 10 may be configured to be the same as the second clock signal CLKB received by the shift register unit 10. As another example, in another example, the third clock signal CLKC received by the shift register unit 10 may further be configured to be different from the second clock signal CLKB received by the shift register unit 10, so that the second signal output terminal OUT2 and the third signal output terminal OUT3 may respectively output different drive signals, thereby improving the driving capability of the shift register unit 10 and increasing the diversity of the output signals of the shift register unit 10.

Although only an example in which the shift register unit includes two or three output terminals is shown above, those skilled in the art can understand that more output terminals can be set according to the actual situation, according to the description of the present disclosure, and the above example should not constitute a limitation on the protection scope of the present disclosure.

It should be noted that the transistors adopted in the embodiments of the present disclosure may all be thin film transistors, field effect transistors, or other switching devices with the like characteristics, and the embodiments of the present disclosure can be described by taking the thin film transistors as an example. A source electrode and a drain electrode of each transistor used here can be symmetrical in structure, so the source electrode and the drain electrode of the transistor may have no difference in structure. In the embodiments of the present disclosure, in order to distinguish two electrodes of a transistor except a gate electrode, one of the two electrodes is referred to as a first electrode described directly, and the other of the two electrodes is referred to as a second electrode. In addition, transistors can be divided into N-type and P-type transistors according to the characteristics of the transistors. In a case where a transistor is a P-type transistor, a turn-on voltage is a voltage at a low level (for example, 0V, −5V, −10V or other suitable voltages), and a turn-off voltage is a voltage at a high level (for example, 5V, 10V or other suitable voltages). In a case where a transistor is an N-type transistor, a turn-on voltage is a voltage at a high level (for example, 5V, 10V or other suitable voltages), and a turn-off voltage is a voltage at a low level (for example, 0V, −5V, −10V or other suitable voltages).

In addition, it should be noted that the transistors used in the shift register unit 10 provided in the embodiments of the present disclosure are all explained by taking a case that the transistors are N-type transistors as examples, and the embodiments of the present disclosure include but are not limited to this case, for example, at least some transistors in the shift register unit 10 may further be used as P-type transistors.

Figure 6:
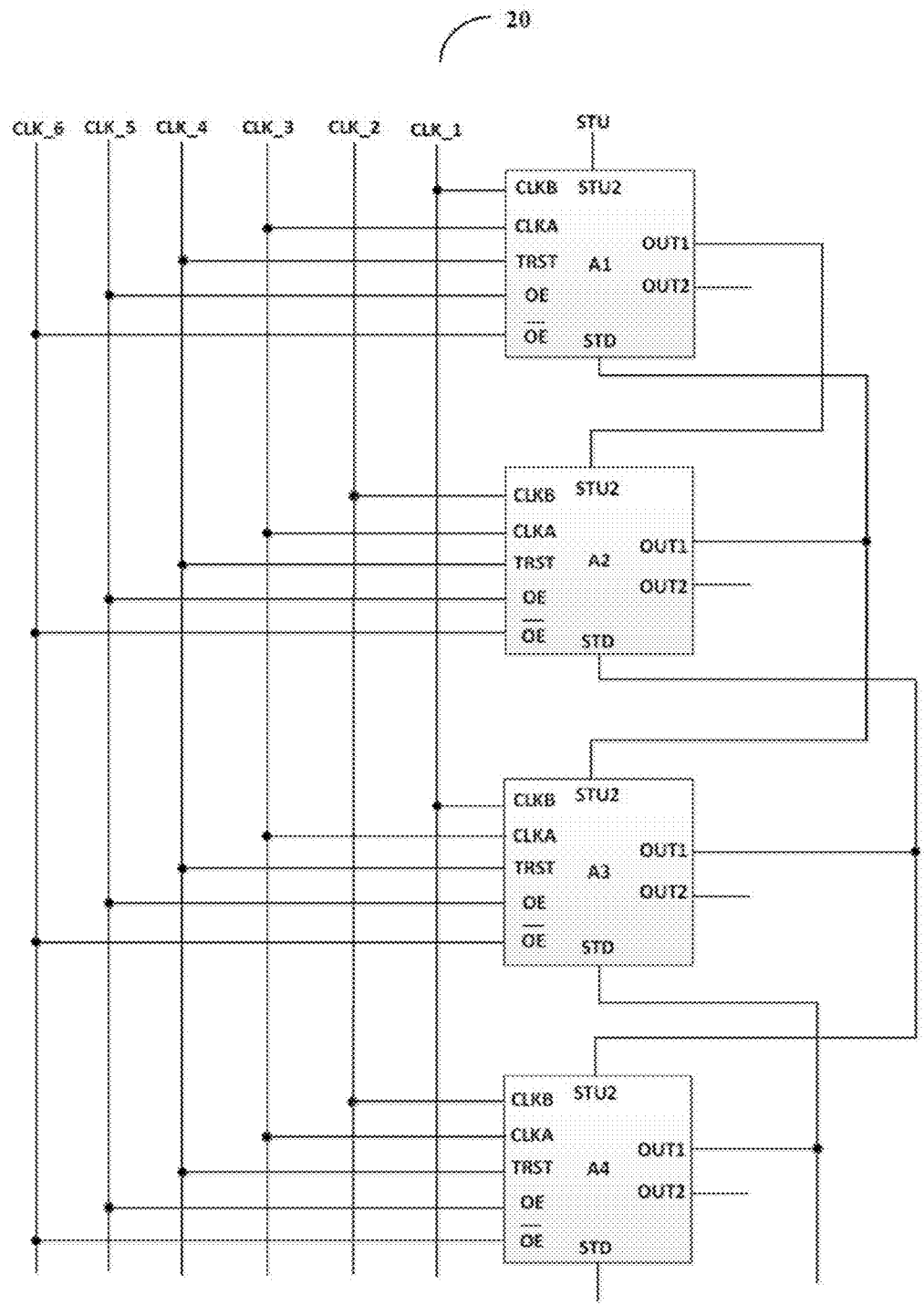
FIG. 6 is a schematic diagram of a gate drive circuit provided by at least one embodiment of the present disclosure.

Some embodiments of the present disclosure further provide a gate drive circuit 20. As shown in FIG. 6, the gate drive circuit 20 includes a plurality of cascaded shift register units 10, in which any one of or a plurality of shift register units 10 may adopt the structure of the shift register unit 10 provided by the embodiments of the present disclosure or variations thereof. It should be noted that only former four stages of shift register units (A1, A2, A3 and A4) of the gate drive circuit 20 are schematically shown in FIG. 6, and the embodiments of the present disclosure include but are not limited to this case.

For example, as shown in FIG. 6, the second signal output terminals OUT2 in respective stages of shift register units 10 may be respectively connected to sub-pixel units in different rows in the display panel to drive scanning transistors or sensing transistors in the sub-pixel units. For example, the shift register unit A1, the shift register unit A2, the shift register unit A3, and the shift register unit A4 can drive the first row of sub-pixel units, the second row of sub-pixel units, the third row of sub-pixel units, and the fourth row of sub-pixel units of the display panel, respectively.

As shown in FIG. 6, the gate drive circuit 20 further includes a first sub-clock signal line CLK_1, a second sub-clock signal line CLK_2, a third sub-clock signal line CLK_3, a fourth sub-clock signal line CLK_4, a fifth sub-clock signal line CLK_5, and a sixth sub-clock signal line CLK_6.

A (2n−1)-th stage of shift register unit is connected to the first sub-clock signal line CLK_1 to receive a clock signal (the second clock signal CLKB) of the first sub-clock signal line CLK_1 and to output the clock signal as an output signal of the (2n−1)-th stage of shift register unit. A 2n-th stage of shift register unit is connected to the second sub-clock signal line CLK_2 to receive a clock signal (the second clock signal CLKB) of the second sub-clock signal line CLK_2 and to output the clock signal as an output signal of the 2n-th stage of shift register unit. Respective stages of shift register units are connected to the third sub-clock signal line CLK_3 to receive the first clock signal CLKA. Respective stages of shift register units are connected to the fourth sub-clock signal line CLK_4 to receive the global reset signal TRST. Respective stages of shift register units are connected to the fifth sub-clock signal line CLK_5 to receive the first selection control signal OE, and Respective stages of shift register units are connected to the sixth sub-clock signal line CLK_6 to receive the second selection control signal $\overline{OE}$; and n is an integer greater than zero.

It should be noted that, in some embodiments, the sixth sub-clock signal line CLK_6 may not be provided. The first selection control signal OE supplied by the fifth sub-clock signal line CLK_5 is supplied to respective stages of shift register units 10 after passing through an inverter.

As shown in FIG. 6, each stage of shift register unit is connected to a first signal output terminal OUT1 of a previous stage of shift register unit to receive an output signal of the previous stage of shift register unit and to take the output signal as the second input signal STU2. Each stage of shift register unit is connected to a first signal output terminal OUT1 of a next stage of shift register unit to receive an output signal of the next stage of shift register unit and to take the output signal as the display reset signal STD.

It should be noted that a cascade relation as shown in FIG. 6 is only an example. According to the description of the present disclosure, other cascade methods can further be adopted according to the actual situation. For example, in a case where clock signals adopted are different, the cascade relation between respective stages of shift register units should be changed accordingly.

Figure 7:
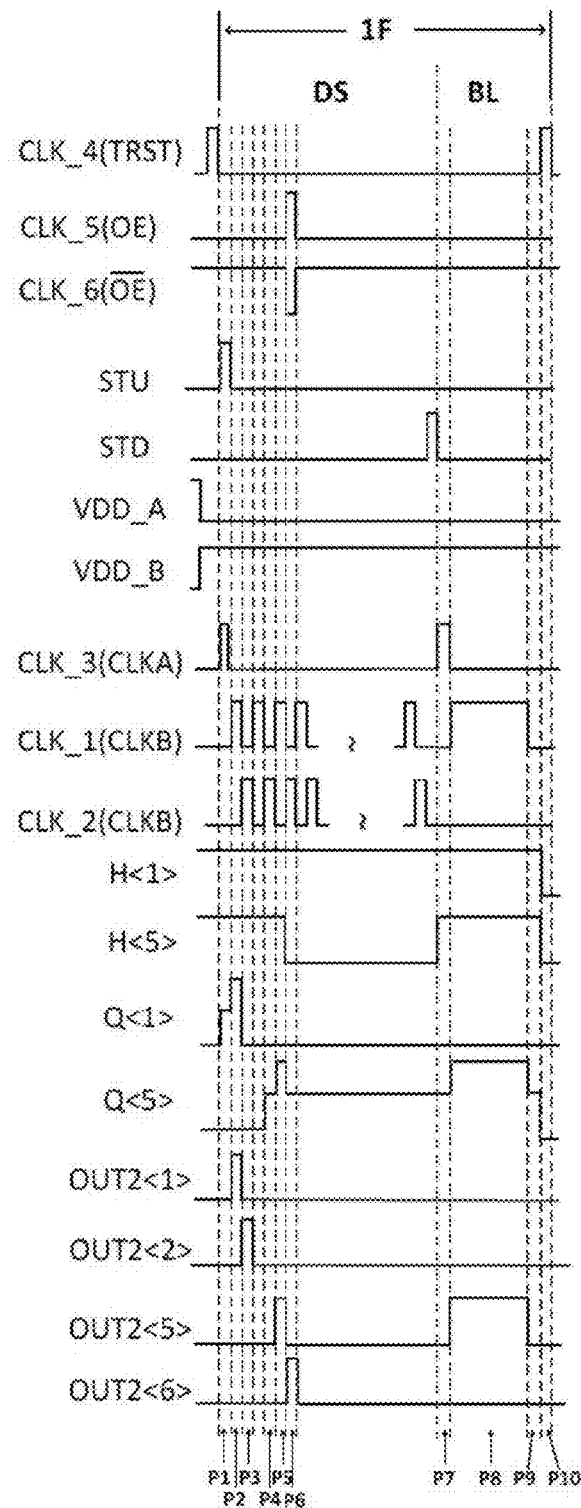
FIG. 7 is a signal timing diagram corresponding to an operation of the gate drive circuit as shown in FIG. 6 provided by at least one embodiment of the present disclosure.

FIG. 7 shows a signal timing diagram corresponding to an operation of the gate drive circuit 20 as shown in FIG. 6. In FIG. 7, H<1> and H<5> respectively represent a first node H in the first stage of shift register unit and a first node H in the fifth stage of shift register unit in the gate drive circuit 20, and Q<1> and Q<5> respectively represent a second node Q in the first stage of shift register unit and a second node Q in the fifth stage shift register unit in the gate drive circuit 20. OUT2<1>, OUT2<2>, OUT2<5>, and OUT2<6> respectively represent signals outputted by second signal output terminals OUT2 in the first stage of shift register unit, the second stage of shift register unit, the fifth stage of shift register unit and the sixth stage of shift register unit in the gate drive circuit 20. It should be noted that, in the present embodiment, for example, signals outputted by the first signal output terminal OUT1 and the second signal output terminal OUT2 of each stage of shift register unit 10 are the same, so that the signals outputted by the first signal output terminals OUT1 of the first stage of shift register unit, the second stage of shift register unit, the fifth stage of shift register unit and the sixth stage of shift register unit are not shown in FIG. 7.

1F represents the first frame, DS represents the display phase of the first frame, BL represents the blanking phase of the first frame. It should be noted that STU in FIG. 7 represents the second input signal received by the first stage of shift register unit, and STD represents the display reset signal received by the last stage of shift register unit.

In addition, it should be noted that, in FIG. 7, the fourth voltage VDD_A is at a low level and the fifth voltage VDD_B is at a high level, but the embodiments of the present disclosure is not limited thereto. The signal level in the signal timing diagram as shown in FIG. 7 is only schematic and does not represent the true level value.

The operational principle of the gate drive circuit 20 as shown in FIG. 6 will be described below with reference to the signal timing diagram in FIG. 7. For example, the shift register unit in the gate drive circuit 20 as shown in FIG. 7 may adopt the shift register unit as shown in FIG. 4.

Before the start of the first frame 1F, the fourth sub-clock signal line CLK_4 provides a high level. Because each stage of shift register unit is connected to the fourth sub-clock signal line CLK_4 to receive the global reset signal TRST, the global reset signal TRST at a high level turns on the seventeenth transistor M17 and the eighteenth transistor M18, so that the first node H and the second node Q of each stage of shift register unit can be reset.

Because the fifth voltage VDD_B is at a high level, the eleventh transistor M11 is turned on, so that the third node QB is charged to a high level. The high level of the third node QB causes the thirteenth transistor M13 to be turned on, so that the level of the second node Q is further pulled down.

In the display phase DS of the first frame 1F, the operation process of the gate drive circuit 20 is described as follows.

In a first phase P1, the second input signal (STU) supplied to the first stage of shift register unit is at a high level, so that the second transistor M2 in the first stage of shift register unit is turned on, and the first voltage VDD at a high level charges the second node Q<1>, so that the level of the second node Q<1> becomes a high level which is held by the second capacitor C2. Meanwhile, in the first phase P1, the first clock signal CLKA provided by the third sub-clock signal line CLK_3 is at a high level, so that the first transistor M1 in the first stage of shift register unit is turned on, and the first clock signal CLKA at a high level charges the first node H<1>, so that the level of the first node H<1> becomes a high level which is held by the first capacitor C1.

The third transistor M3 is turned on under control of the high level of the first node H<1> and the fourth transistor M4 and the fifth transistor M5 are turned on under control of the high level of the second node Q<1>. However, because the second clock signal CLKB (supplied by the first sub-clock signal line CLK_1) received by the first stage of shift register unit is at a low level at this time, the second output terminal OUT2<1> of the first stage of shift register unit outputs a signal at a low level.

In a second phase P2, the third transistor M3, the fourth transistor M4, and the fifth transistor M5 are kept in a turn-on state due to a holding function of the first capacitor C1 and the second capacitor C2. Meanwhile, the second clock signal CLKB received by the first stage of shift register unit becomes at a high level, and the second output terminal OUT2<1> of the first stage of shift register unit outputs the signal at a high level. It should be noted that, the first signal output terminal of the first stage of shift register unit in the second phase P2 further outputs the signal at a high level, which is not shown in FIG. 7. For example, the signal at a high level outputted by the first signal output terminal of the first stage of shift register unit may be supplied to the second stage of shift register unit as the second input signal STU2, so that a row by row scanning display is realized. The signal at a high level outputted by the second output terminal OUT2<1> of the first stage of shift register unit can be configured to drive a row of sub-pixel units in the display panel for display. Meanwhile, in this phase, the level of the second node Q<1> is further pulled up due to a bootstrap effect of the second capacitor C2.

In a third phase P3, because the second clock signal CLKB received by the first stage of shift register unit becomes at a low level, the second output terminal OUT2<1> of the first stage shift register unit outputs the signal at a low level. Meanwhile, in the third phase P3, the signal outputted by the first signal output terminal of the second stage of shift register unit (the same as the second signal output terminal OUT2<2>) is at a high level, so that the display reset signal STD received by the first stage of shift register unit is at a high level. In addition, the second selection control signal $\overline{OE}$ supplied by the sixth sub-clock signal line CLK_6 is further at a high level, so that the eighth transistor M8 and the ninth transistor M9 are turned on. The third voltage VGL2 at a low level performs pull-down and reset on the level of the second node Q<1>, so that the level of the second node Q<1> becomes a low level.

Because the level of the second node Q<1> is a low level, the twelfth transistor M12 is turned off. The eleventh transistor M11 may charge the third node QB to pull up the level of the third node QB. Because the third node QB is at a high level, the thirteenth transistor M13, the fourteenth transistor M14, and the fifteenth transistor M15 can be controlled to be turned on, so that the level of the second node Q<1>, the level of the first signal output terminal, and the level of the second signal output terminal OUT2<1> can be further pulled down and reset to realize a noise reduction function.

After the first stage of shift register unit drives the first row of sub-pixels in the display panel to complete display, and so on, the second stage of shift register unit and the third stage of shift register unit drive the sub-pixel units of the display panel row by row to complete the display drive of one frame. Heretofore, the display phase DS of the first frame 1F ends.

For example, in a case where compensation is required for the fifth row of sub-pixel units in the first frame 1F, the following operation is further performed on the fifth stage of shift register unit in the display phase DS of the first frame 1F.

In a fourth phase P4, the second input circuit in the fifth stage of shift register unit charges the second node Q<5>. In the fifth phase P5, the output circuit of the fifth stage of shift register unit outputs a drive signal. It should be noted that, the operational process of the fourth phase P4 and the operational process of the fifth stage P5 are similar to those of the first phase P1 and the second phase P2, respectively, and are not be repeated herein again.

In a sixth phase P6, the first selection control signal OE supplied by the fifth sub-clock signal line CLK_5 becomes at a high level, the display reset signal received by the fifth stage of shift register unit in the sixth phase P6 (which is the same as the signal outputted by the first signal output terminal of the sixth stage of shift register unit) simultaneously becomes at a high level. Therefore, the sixth transistor M6 and the seventh transistor M7 are turned on, the second voltage VGL1 at a low level pulls down and resets the level of the first node H<5>, and the level of the first node H<5> becomes a low level.

Meanwhile, in the sixth phase P6, although the display reset signal received by the fifth stage of shift register unit is at a high level, and the eighth transistor is turned on, because the second selection control signal is at a low level, the ninth transistor M9 is turned off. Therefore, the second selection reset circuit does not pull-down and reset the level of the second node Q<5>. But, at this phase, the signal outputted by the first signal output terminal is at a low level. Because the bootstrap effect of the second capacitor C2, the level of the second node Q<5> is dropped with a certain amount, but the second node Q<5> still remain at a high level. For example, the high level may be maintained into the blanking phase BL of the first frame 1F.

In the sixth phase P6, because the level of the second node Q<5> is not pulled down to a low level, and the high level of the second node Q<5> may be maintained into the blanking phase BL, the first node H<5> is needed to be reset to pull down the level of the first node H<5>, thereby preventing the fifth stage of shift register unit from outputting a drive signal in a subsequent phase of the display phase DS.

For example, in a case where compensation is required for the fifth row of sub-pixel units in the first frame 1F, the following operation is further performed on the fifth stage of shift register unit in the blanking phase BL of the first frame 1F.

In a seven phase P7, the first clock signal CLKA supplied by the third sub-clock signal line CLK_3 becomes at a high level, the first transistor M1 is turned on, and the first clock signal CLKA at a high level charges the first node H<5>, so that the level of the first node H<5> becomes a high level which is held by the first capacitor C1.

In an eighth phase P8, the second clock signal CLKB received by the fifth stage of shift register unit (supplied by the first sub-clock signal line CLK_1) becomes at a high level, and the level of the second node Q<5> is further pulled up due to the bootstrap effect of the second capacitor C2. Because the level of the first node H<5> and the level of the second node Q<5> are both high levels, the third transistor M3, the fourth transistor M4, and the fifth transistor M5 are turned on, so that the second clock signal CLKB at a high level can be output to the first signal output terminal and the second signal output terminal OUT2<5>. For example, the signal at a high level outputted by the second signal output terminal OUT2<5> can be configured to drive the fifth row of sub-pixel units in the display panel to realize the external compensation.

In a ninth phase P9, the level of the second clock signal CLKB received by the fifth stage of shift register unit changes from a high level to a low level, and the level of the second node Q<5> is dropped with a certain amount due to the bootstrap effect of the second capacitor C2.

In a tenth phase P9, the global reset signal TRST provided by the fourth sub-clock signal line CLK_4 is at a high level, therefore, the seventeenth transistor M17 and the eighteenth transistor M18 in each stage of shift register unit are turned on, so that the level of the first node H and the level of the second node Q in each stage of shift register unit can be pulled down and reset to realize the global reset of the gate drive circuit 20.

Heretofore, a drive timing of the first frame ends. The method for driving the gate drive circuit in subsequent frames, such as a second frame, a third frame, and etc., may be referred to the above description, and details are not described herein again.

It should be noted that, in the above description, the operational principle of the random compensation is described by taking a case that the drive signal corresponding to the fifth row of sub-pixel units of the display panel is outputted in the blanking phase of the first frame as an example, the present disclosure is not limited to this case. For example, in a case where a drive signal is needed to be outputted corresponding to an n-th row of sub-pixel units of the display panel in the blanking phase of a certain frame (n is an integer greater than zero), the following operation may be performed.

For example, in the display phase of a frame, in a case where the display reset signal STD received by an n-th stage of shift register unit is at a high level, the first selection control signal OE received by the n-th stage of shift register unit is further at a high level, thereby pulling down the level of the first node H of the n-th stage of shift register unit to a low level. Meanwhile, the second selection control signal $\overline{OE}$ received by the n-th stage of shift register unit is at a low level to ensure that the level of the second node Q of the n-th stage of shift register unit is not pulled down to a low level, and the high level of the second node Q of the n-th stage shift register unit can be kept into the blanking phase of the frame.

In the display phase, the second node Q in the other stages of shift register units except the n-th stage of shift register unit is normally reset.

In the blanking phase of the frame, at first, the first node H in the n-th stage of shift register unit is charged to pull up the level of the first node H. Then, in a case where a drive signal is needed to be outputted, the second clock signal CLKB at a high level is supplied, and the output circuit 300 which is turned on outputs the second clock signal CLKB as an output signal to the first signal output terminal OUT1 and the second signal output terminal OUT2. The signal outputted by the second signal output terminal OUT2 can, for example, drive a row of sub-pixel units in the display panel for the external compensation.

The gate drive circuit 20 provided by the embodiments of the present disclosure, can further realize the random compensation under the premise of realizing row by row sequential compensation (for example, the row by row sequential compensation is required in shutdown detection), so that poor display problems, such as scanning lines and uneven display brightness caused by the row by row sequential compensation can be avoided.

Figure 8:
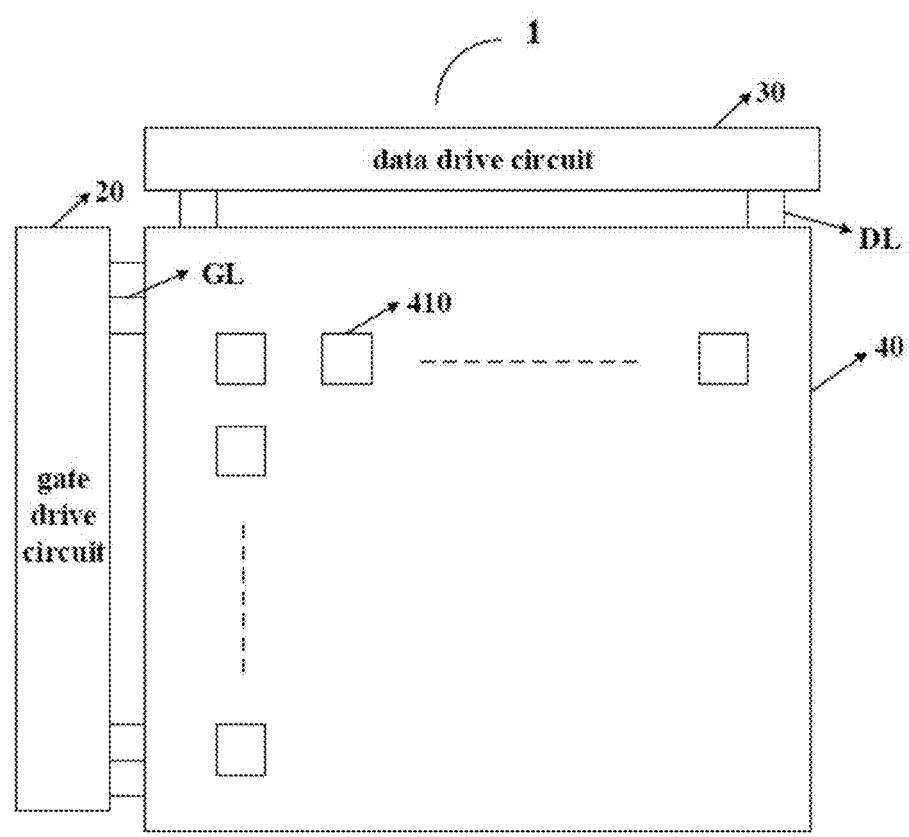
FIG. 8 is a schematic diagram of a display device provided by at least one embodiment of the present disclosure.

At least one embodiment of the present disclosure provides a display device 1. As shown in FIG. 8, the display device 1 includes a gate drive circuit 20 provided by an embodiment of the present disclosure. The display device 1 further includes a display panel 40. The display panel 40 includes an array including a plurality of sub-pixel units 410. For example, the display device 1 may further include a data drive circuit 30. The data drive circuit 30 is configured to supply data signals to a pixel array. The gate drive circuit 20 is configured to supply drive signals to the pixel array, for example, the drive signals may drive the scanning transistor and the sensing transistor in the sub-pixel unit 410. The data drive circuit 30 is electrically connected to the sub-pixel units 410 through data lines DL, and the gate drive circuit 20 is electrically connected to the sub-pixel units 410 through gate lines GL.

It should be noted that the display device 1 in the present embodiment can be any product or component with a display function, such as a liquid crystal panel, a liquid crystal television, a display, an OLED panel, an OLED television, an electronic paper display device, a mobile phone, a tablet computer, a notebook computer, a digital photo frame, a navigator, and etc.

Technical effects of the display device 1 provided by the embodiments of the present disclosure may refer to the corresponding description of the gate drive circuit 20 in the above embodiments, and details are not described herein again.

Embodiments of the present disclosure further provide a drive method, which can be applied to drive the shift register unit 10 provided by the embodiments of the present disclosure. A plurality of shift register units 10 can be cascaded to construct a gate drive circuit 20 of the embodiment of the present disclosure, and the gate drive circuit 20 is configured to drive the display panel to display at least one frame of an image.

The drive method includes a display phase DS and a blanking phase BL of one frame. As shown in FIG. 9, the drive method includes the following operational steps.

Step S100: in a display phase DS, in response to the first input signal STU1, charging the first node H by the first input circuit 100, in response to the second input signal STU2, charging the second node Q by the second input circuit 200, and under the common control of the level of the first node H and the level of the second node Q, outputting the output signal to the output terminal OP by the output circuit 300.

Step S200: in a blanking phase BL, in response to the first input signal STU1, charging the first node H by the first input circuit 100, and under the common control of the level of the first node H and the level of the second node Q, outputting the output signal to the output terminal OP by the output circuit 300.

Some embodiments of the present disclosure further provide another drive method that can be used to the gate drive circuit 20 provided by the embodiments of the present disclosure, which is configured to drive the display panel to display at least one frame of an image.

The drive method includes a display phase DS and a blanking phase BL of one frame. In a case where each stage of shift register unit 10 includes a first selection reset circuit 400 and a second selection reset circuit 500, as shown in FIG. 10, the drive method includes the following operational steps.

Step S300: in the display phase DS, in response to a first selection control signal OE and a display reset signal STD, resetting a first node H of an m-th stage of shift register unit by a first selection reset circuit 400 of the m-th stage of shift register unit. And in response to a second selection control signal $\overline{OE}$ and the display reset signal STD, resetting second nodes Q of other stages of shift register units other than the m-th stage of shift register unit by second selection reset circuits 500 of other stages of shift register units other than the m-th stage shift register unit.

Step S400: in the blanking phase BL, in response to the first input signal STU1, charging the first node H of the m-th stage of shift register unit by a first input circuit 100 of the m-th stage of shift register unit. And m is an integer greater than zero.

It should be noted that the detailed description and technical effects of the drive method provided by the embodiments of the present disclosure may refer to the description of the operational principles of the shift register unit 10 and the gate drive circuit 20 in the embodiments of the present disclosure, which will not be repeated herein again.

What are described above is related to illustrative embodiments of the disclosure only, and not limitative to the protection scope of the present disclosure. The protection scope of the present disclosure should be defined by the accompanying claims.

What is claimed is:

1. A shift register unit comprising a first input circuit, second input circuit, an output circuit, a first selection reset circuit and a second selection reset circuit,
    wherein the first input circuit is configured to charge a first node in response to a first input signal to control a level of the first node;
    the second input circuit is configured to charge a second node in response to a second input signal to control a level of the second node; and
    the output circuit is configured to output an output signal to an output terminal under common control of the level of the first node and the level of the second node;
    the first selection reset circuit is connected to the first node, and is configured to reset the first node in response to a first selection control signal and a display reset signal;

the second selection reset circuit is connected to the second node, and is configured to reset the second node in response to a second selection control signal and the display reset signal; and
    the first selection control signal and the second selection control signal are inversion signals to each other.

2. The shift register unit according to claim 1,
    wherein the first input circuit is connected to the first node, and the first input circuit is configured to receive a first clock signal and take the first clock signal as the first input signal, and to charge the first node with the first clock signal under control of the first clock signal.

3. The shift register unit according to claim 2, wherein the first input circuit comprises a first transistor and a first capacitor,
    a gate electrode of the first transistor is connected to a first electrode of the first transistor, and is configured to receive the first clock signal, and a second electrode of the first transistor is connected to the first node; and
    a first electrode of the first capacitor is connected to the first node, and a second electrode of the first capacitor is configured to receive a second voltage.

4. The shift register unit according to claim 1,
    wherein the second input circuit is connected to the second node, and the second input circuit is configured to receive the second input signal and a first voltage, and to charge the second node with the first voltage under control of the second input signal.

5. The shift register unit according to claim 4, wherein the second input circuit comprises a second transistor,
    a gate electrode of the second transistor is configured to receive the second input signal, a first electrode of the second transistor is configured to receive the first voltage, and a second electrode of the second transistor is connected to the second node.

6. The shift register unit according to claim 1,
    wherein the output circuit is connected to the first node and the second node, and the output circuit is configured to receive a second clock signal, and to output the second clock signal as the output signal to the output terminal under the common control of the level of the first node and the level of the second node.

7. The shift register unit according to claim 6, wherein the output terminal comprises a first signal output terminal and a second signal output terminal, the first signal output terminal and the second signal output terminal are configured to output the output signal, and the output circuit comprises a third transistor, a fourth transistor, a fifth transistor, and a second capacitor;
    a gate electrode of the third transistor is connected to the first node, a first electrode of the third transistor is configured to receive the second clock signal, and a second electrode of the third transistor is connected to a first electrode of the fourth transistor;
    a gate electrode of the fourth transistor is connected to the second node, and a second electrode of the fourth transistor is connected to the first signal output terminal;
    a gate electrode of the fifth transistor is connected to the second node, a first electrode of the fifth transistor is connected to the second electrode of the third transistor, and a second electrode of the fifth transistor is connected to the second signal output terminal; and
    a first electrode of the second capacitor is connected to the second node, and a second electrode of the second capacitor is connected to the first signal output terminal.

8. The shift register unit according to claim 7, wherein the output terminal further comprises a third signal output terminal, and the output circuit further comprises a nineteenth transistor and a twentieth transistor,
- a gate electrode of the nineteenth transistor is connected to the first node, a first electrode of the nineteenth transistor is configured to receive a third clock signal, and a second electrode of the nineteenth transistor is connected to a first electrode of the twentieth transistor; and
- a gate electrode of the twentieth transistor is connected to the second node, and a second electrode of the twentieth transistor is connected to the third signal output terminal.

9. The shift register unit according to claim 1,
- wherein the first selection reset circuit is configured to receive a second voltage, and to reset the first node with the second voltage under control of the first selection control signal and the display reset signal; and
- the second selection reset circuit is configured to receive a third voltage, and to reset the second node with the third voltage under control of the second selection control signal and the display reset signal.

10. The shift register unit according to claim 9, wherein the first selection reset circuit comprises a sixth transistor and a seventh transistor,
- a gate electrode of the sixth transistor is configured to receive the first selection control signal, a first electrode of the sixth transistor is connected to the first node, and a second electrode of the sixth transistor is connected to a first electrode of the seventh transistor; and
- a gate electrode of the seventh transistor is configured to receive the display reset signal, and a second electrode of the seventh transistor is configured to receive the second voltage.

11. The shift register unit according to claim 9, wherein the second selection reset circuit comprises an eighth transistor and a ninth transistor,
- a gate electrode of the eighth transistor is configured to receive the display reset signal, a first electrode of the eighth transistor is connected to the second node, and a second electrode of the eighth transistor is connected to a first electrode of the ninth transistor; and
- a gate electrode of the ninth transistor is configured to receive the second selection control signal, and a second electrode of the ninth transistor is configured to receive the third voltage.

12. The shift register unit according to claim 1, further comprising a second reset circuit,
- wherein the second reset circuit is configured to reset the first node in response to a global reset signal.

13. The shift register unit according to claim 12, wherein the second reset circuit comprises a seventeenth transistor,
- a gate electrode of the seventeenth transistor is configured to receive the global reset signal, a first electrode of the seventeenth transistor is connected to the first node, and a second electrode of the seventeenth transistor is configured to receive an eighth voltage.

14. The shift register unit according to claim 1,
- wherein the first input circuit comprises a first transistor and a first capacitor, a gate electrode of the first transistor is connected to a first electrode of the first transistor, and is configured to receive a first clock signal, and a second electrode of the first transistor is connected to the first node;

a first electrode of the first capacitor is connected to the first node, and a second electrode of the first capacitor is configured to receive a second voltage;
the second input circuit comprises a second transistor, a gate electrode of the second transistor is configured to receive the second input signal, a first electrode of the second transistor is configured to receive a first voltage, and a second electrode of the second transistor is connected to the second node;
the output terminal comprises a first signal output terminal and a second signal output terminal, the first signal output terminal and the second signal output terminal are configured to output the output signal, and the output circuit comprises a third transistor, a fourth transistor, a fifth transistor, and a second capacitor;
a gate electrode of the third transistor is connected to the first node, a first electrode of the third transistor is configured to receive the second clock signal, and a second electrode of the third transistor is connected to a first electrode of the fourth transistor;
a gate electrode of the fourth transistor is connected to the second node, and a second electrode of the fourth transistor is connected to the first signal output terminal;
a gate electrode of the fifth transistor is connected to the second node, a first electrode of the fifth transistor is connected to the second electrode of the third transistor, and a second electrode of the fifth transistor is connected to the second signal output terminal;
a first electrode of the second capacitor is connected to the second node, and a second electrode of the second capacitor is connected to the first signal output terminal;
the first selection reset circuit comprises a sixth transistor and a seventh transistor;
a gate electrode of the sixth transistor is configured to receive the first selection control signal, a first electrode of the sixth transistor is connected to the first node, and a second electrode of the sixth transistor is connected to a first electrode of the seventh transistor;
a gate electrode of the seventh transistor is configured to receive the display reset signal, and a second electrode of the seventh transistor is configured to receive the second voltage;
the second selection reset circuit comprises an eighth transistor and a ninth transistor;
a gate electrode of the eighth transistor is configured to receive the display reset signal, a first electrode of the eighth transistor is connected to the second node, and a second electrode of the eighth transistor is connected to a first electrode of the ninth transistor;
a gate electrode of the ninth transistor is configured to receive the second selection control signal, and a second electrode of the ninth transistor is configured to receive a third voltage;
the shift register unit further comprises a tenth transistor, an eleventh transistor, a twelfth transistor, a thirteenth transistor, a fourteenth transistor, a fifteenth transistor, a sixteenth transistor, a seventeenth transistor, and an eighteenth transistor;
a gate electrode of the tenth transistor is connected to a first electrode of the tenth transistor, and is configured to receive a fourth voltage, and a second electrode of the tenth transistor is connected to a third node;
a gate electrode of the eleventh transistor is connected to a first electrode of the eleventh transistor, and is configured to receive a fifth voltage, and a second electrode of the eleventh transistor is connected to the third node;

a gate electrode of the twelfth transistor is connected to the second node, a first electrode of the twelfth transistor is connected to the third node, and a second electrode of the twelfth transistor is configured to receive the third voltage;

a gate electrode of the sixteenth transistor is configure to receive the second input signal, a first electrode of the sixteenth transistor is connected to the third node, and a second electrode of the sixteenth transistor is configure to receive the third voltage;

a gate electrode of the thirteenth transistor is connected to the third node, a first electrode of the thirteenth transistor is connected to the second node, and a second electrode of the thirteenth transistor is configured to receive the third voltage;

a gate electrode of the fourteenth transistor is connected to the third node, a first electrode of the fourteenth transistor is connected to the first signal output terminal, and a second electrode of the fourteenth transistor is configured to receive the third voltage;

a gate electrode of the fifteenth transistor is connected to the third node, a first electrode of the fifteenth transistor is connected to the second signal output terminal, and a second electrode of the fifteenth transistor is configured to receive a sixth voltage;

a gate electrode of the seventeenth transistor is configured to receive a global reset signal, a first electrode of the seventeenth transistor is connected to the first node, and a second electrode of the seventeenth transistor is configured to receive an eighth voltage; and a gate electrode of the eighteenth transistor is configured to receive the global reset signal, a first electrode of the eighteenth transistor is connected to the second node, and a second electrode of the eighteenth transistor is configured to receive the third voltage.

15. A gate drive circuit, comprising a plurality of cascaded shift register units, each of which is according to claim 1.

16. The gate drive circuit according to claim 15, further comprising a first sub-clock signal line and a second sub-clock signal line,
wherein an output circuit of a (2n−1)-th stage of shift register unit is connected to the first sub-clock signal line to receive a clock signal of the first sub-clock signal line and to output the clock signal, as an output signal of the (2n−1)-th stage of shift register unit, of the first sub-clock signal line; and
an output circuit of a 2n-th stage of shift register unit is connected to the second sub-clock signal line to receive a clock signal of the second sub-clock signal line and outputs the clock signal, as an output signal of the 2n-th stage of shift register unit, of the second sub-clock signal line,
wherein n is an integer greater than zero.

17. A drive method of the shift register unit according to claim 15, comprising a display phase and a blanking phase of one frame, the drive method comprising:
in the display phase, in response to a first selection control signal and a display reset signal, resetting a first node of an m-th stage of shift register unit by a first selection reset circuit of the m-th stage of shift register unit; and
in response to a second selection control signal and the display reset signal, resetting second nodes of other stages of shift register units other than the m-th stage of shift register unit by second selection reset circuits of other stages of shift register units other than the m-th stage shift register unit;
in the blanking phase, in response to the first input signal, charging the first node of the m-th stage of shift register unit by a first input circuit of the m-th stage of shift register unit; and
m is an integer greater than zero.

18. A gate drive circuit, comprising a plurality of cascaded shift register units, each of which is according to claim 1, a fifth sub-clock signal line, a sixth sub-clock signal line,
wherein respective stages of shift register units are connected to the fifth sub-clock signal line to receive the first selection control signal; and
the respective stages of shift register units are connected to the sixth sub-clock signal line to receive the second selection control signal.

19. A drive method of the shift register unit according to claim 1, comprising a display phase and a blanking phase of one frame,
wherein in the display phase, in response to the first input signal, charging the first node by the first input circuit,
in response to the second input signal, charging the second node by the second input circuit, and
under the common control of the level of the first node and the level of the second node, outputting the output signal to the output terminal by the output circuit; and
in the blanking phase, in response to the first input signal, charging the first node by the first input circuit, and
under the common control of the level of the first node and the level of the second node, outputting the output signal to the output terminal by the output circuit.

* * * * *